US011903221B2

(12) United States Patent
Wang et al.

(10) Patent No.: US 11,903,221 B2
(45) Date of Patent: Feb. 13, 2024

(54) THREE DIMENSIONAL SEMICONDUCTOR DEVICE WITH MEMORY STACK

(71) Applicant: Taiwan Semiconductor Manufacturing Co., Ltd., Hsinchu (TW)

(72) Inventors: Chenchen Wang, Hsinchu (TW); Chun-Chieh Lu, Taipei (TW); Chi On Chui, Hsinchu (TW); Yu-Ming Lin, Hsinchu (TW); Sai-Hooi Yeong, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 242 days.

(21) Appl. No.: 17/156,320

(22) Filed: Jan. 22, 2021

(65) Prior Publication Data

US 2022/0052115 A1    Feb. 17, 2022

Related U.S. Application Data

(60) Provisional application No. 63/066,369, filed on Aug. 17, 2020.

(51) Int. Cl.
*H10B 63/00* (2023.01)
*H01L 29/423* (2006.01)
(Continued)

(52) U.S. Cl.
CPC ....... *H10B 63/84* (2023.02); *H01L 29/42392* (2013.01); *H01L 29/66666* (2013.01);
(Continued)

(58) Field of Classification Search
CPC ........ H10B 63/84; H10B 61/22; H10B 63/34; H10B 63/80; H10B 63/30; H10B 61/20; H01L 29/42392; H01L 29/66666; H01L 29/78642; H01L 29/7869; H01L 25/0657; H01L 21/8221; H01L 27/0688;
(Continued)

(56) References Cited

U.S. PATENT DOCUMENTS 10,847,511 B2 * 11/2020 Beigel ................. H01L 27/0688
11,600,489 B2 *  3/2023 Yamazaki ....... H01L 21/823412
(Continued)

FOREIGN PATENT DOCUMENTS

JP      2010182818 A    8/2010
KR    20060028575 A    3/2006
(Continued)

OTHER PUBLICATIONS

Wu, X. et al., "Design Exploration of Hybrid Caches with Disparate Memory Technologies," ACM Transactions on Architecture and Code Optimization, vol. 7, No. 3, Article 15, Dec. 2010, 34 pages.

*Primary Examiner* — Selim U Ahmed
(74) *Attorney, Agent, or Firm* — Slater Matsil, LLP

(57) ABSTRACT

A device includes a first transistor over a substrate, a second transistor disposed over the first transistor, and a memory element disposed over the second transistor. The second transistor includes a channel layer, a gate dielectric layer surrounding a sidewall of the channel layer, and a gate electrode surrounding a sidewall of the gate dielectric layer.

20 Claims, 48 Drawing Sheets

(51) Int. Cl.
  *H01L 29/66* (2006.01)
  *H01L 29/786* (2006.01)
  *H10B 61/00* (2023.01)
(52) U.S. Cl.
  CPC ....... *H01L 29/78642* (2013.01); *H10B 61/22* (2023.02); *H10B 63/34* (2023.02)
(58) Field of Classification Search
  CPC ....... H01L 21/823807; H01L 27/11582; H01L 29/66545; H01L 21/823412
  See application file for complete search history.

(56) References Cited

U.S. PATENT DOCUMENTS

| 2006/0076625 | A1 | 4/2006 | Lee et al. | |
| 2010/0193784 | A1 | 8/2010 | Morosawa et al. | |
| 2011/0058418 | A1* | 3/2011 | Choi | H01L 29/7926 |
| | | | | 257/E21.409 |
| 2012/0126308 | A1* | 5/2012 | Kim | H10B 43/35 |
| | | | | 438/589 |
| 2013/0161583 | A1* | 6/2013 | Blomme | H10N 70/8836 |
| | | | | 257/5 |
| 2018/0061835 | A1* | 3/2018 | Yang | H01L 29/42376 |
| 2018/0323195 | A1* | 11/2018 | Mehandru | H01L 21/823821 |
| 2019/0295626 | A1 | 9/2019 | Ikeda et al. | |
| 2019/0312055 | A1* | 10/2019 | Baek | H01L 27/0688 |
| 2019/0348540 | A1* | 11/2019 | Pillarisetty | H01L 21/823475 |
| 2019/0393356 | A1* | 12/2019 | Le | H01L 29/78603 |
| 2020/0066874 | A1* | 2/2020 | Balakrishnan | H01L 29/4232 |
| 2020/0144330 | A1 | 5/2020 | Majhi et al. | |
| 2020/0176032 | A1 | 6/2020 | Chiang et al. | |
| 2020/0335581 | A1* | 10/2020 | Li | H01L 27/0688 |
| 2021/0391207 | A1* | 12/2021 | Gardner | H01L 27/0688 |
| 2022/0238704 | A1* | 7/2022 | Colinge | H01L 21/441 |

FOREIGN PATENT DOCUMENTS

| KR | 20200066548 A | 6/2020 |
| WO | 2020142440 A1 | 7/2020 |

* cited by examiner

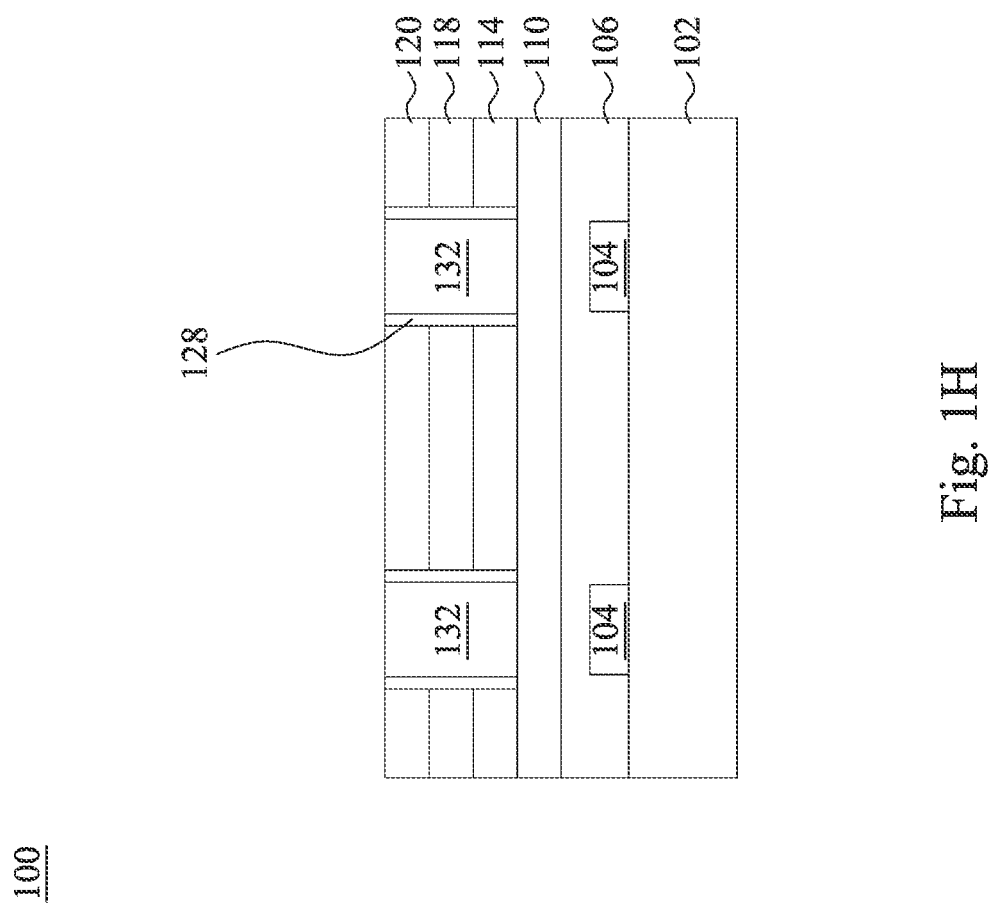

THREE DIMENSIONAL SEMICONDUCTOR DEVICE WITH MEMORY STACK

PRIORITY CLAIM AND CROSS-REFERENCE

This application claims the benefit of the U.S. Provisional Application No. 63/066,369, filed Aug. 17, 2020, and entitled "Semiconductor Device and Method for Fabricating the Same," which application is hereby incorporated herein by reference.

BACKGROUND

Many modern-day electronic devices contain electronic memory. Electronic memory may be volatile memory or non-volatile memory. Non-volatile memory retains its stored data in the absence of power, whereas volatile memory loses its stored data when power is lost. Emerging memory such as resistive random access memory (RRAM), magnetoresistive random access memory (MRAM), and phase-change random access memory (PCRAM) are promising candidates for next-generation non-volatile memory due to its simple structure and its compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
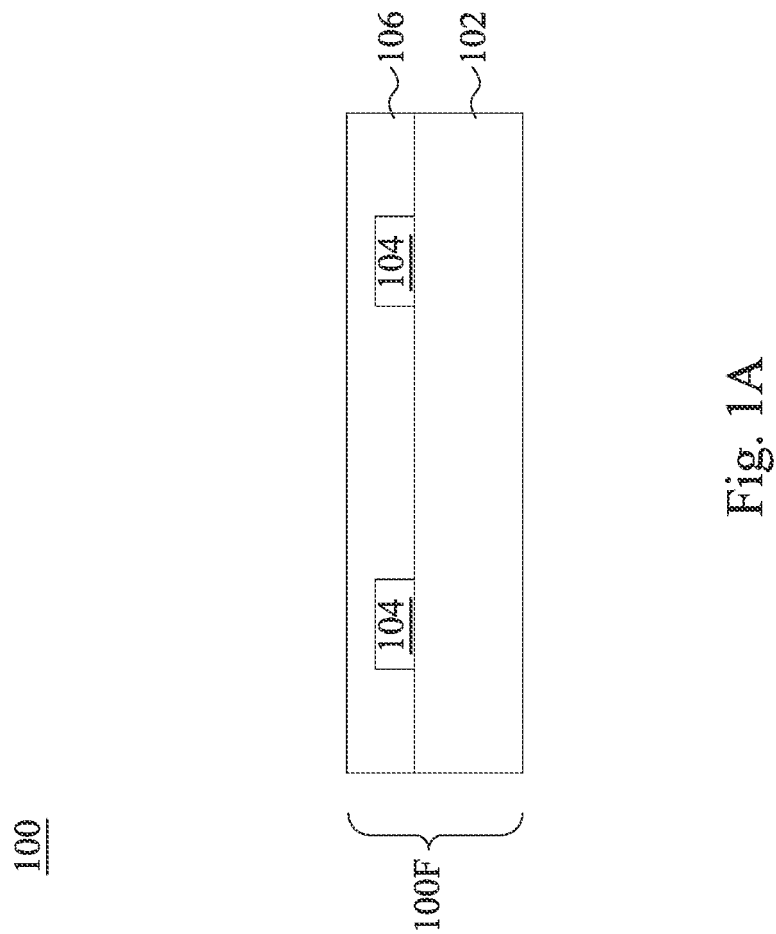
FIGS. 1A to 1R show exemplary cross-sectional and plan views of a semiconductor device at intermediate stages in accordance with embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

The present disclosure is directed to a semiconductor device having logic circuits with high-density embedded memory arrays. The semiconductor device of the present disclosure includes a front-end-of-line (FEOL) portion and a back-end-of-line (BEOL) portion disposed over the FEOL portion. Memory cells including a memory array and a transistor array are formed in the BEOL portion of the semiconductor device. Each of the memory cells includes a resistive random access memory (RRAM) cell, a phase change random access memory (PCRAM) cell, a magnetoresistive random access memory (MRAM) cell, or any type of memory compatible with nano-scale logic circuits. Each of the memory cells can store a single bit, which may be read from or written to. Logic circuits, input/output (I/O) circuits, electrostatic discharge (ESD) circuits, and any other circuitry may be formed in the FEOL portion of the semiconductor device.

Figure 1B:
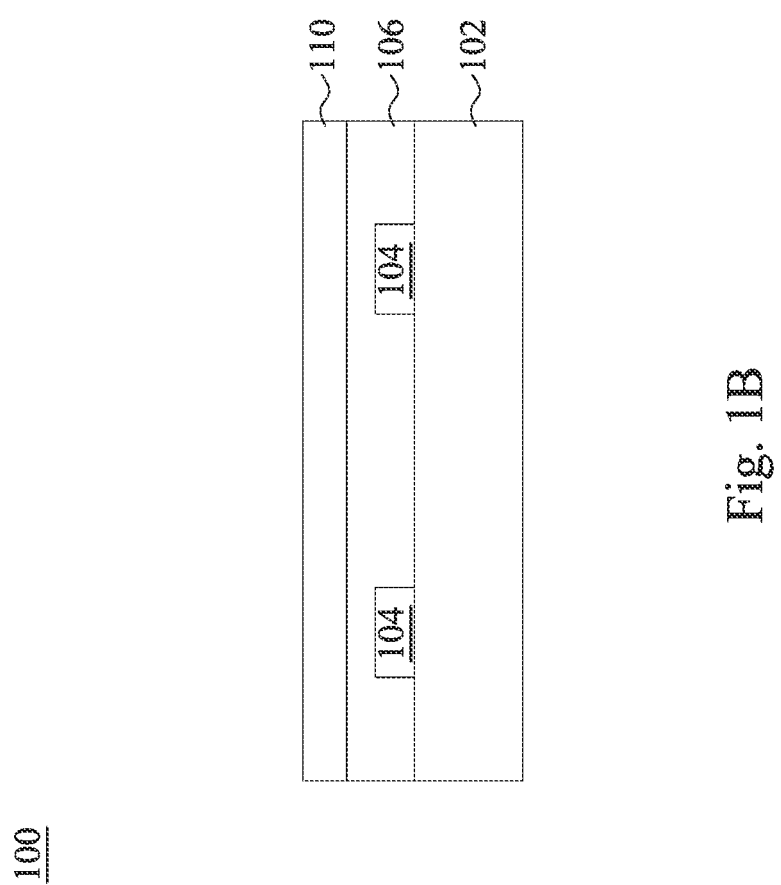
FIG. 1S shows an equivalent circuit diagram of memory cells in accordance with embodiments of the present disclosure.
Figure 1C:
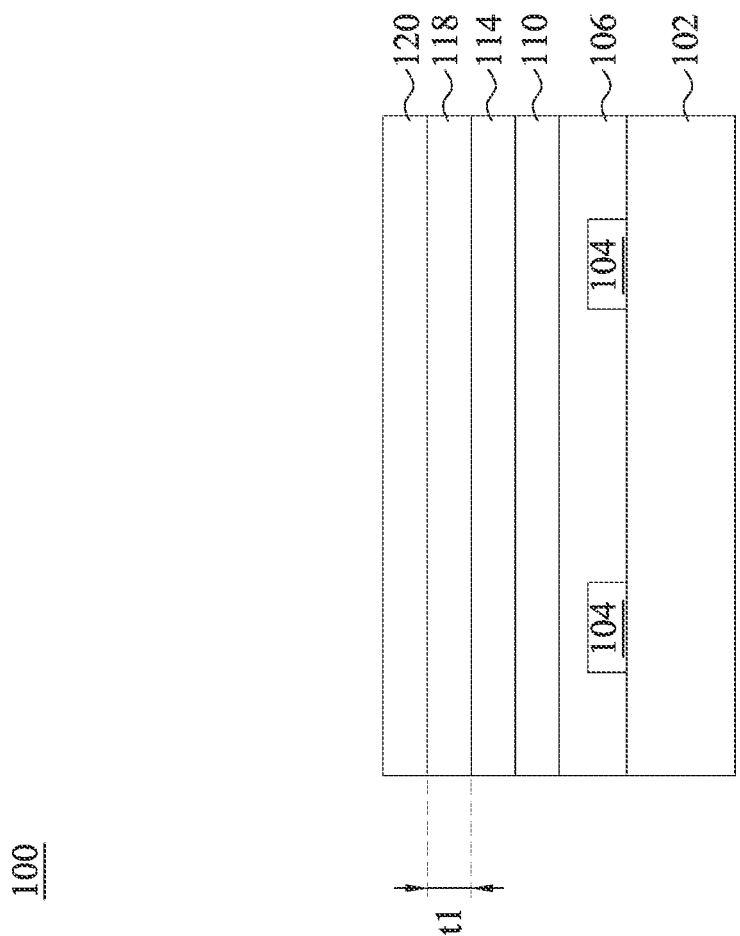
Figure 1D:
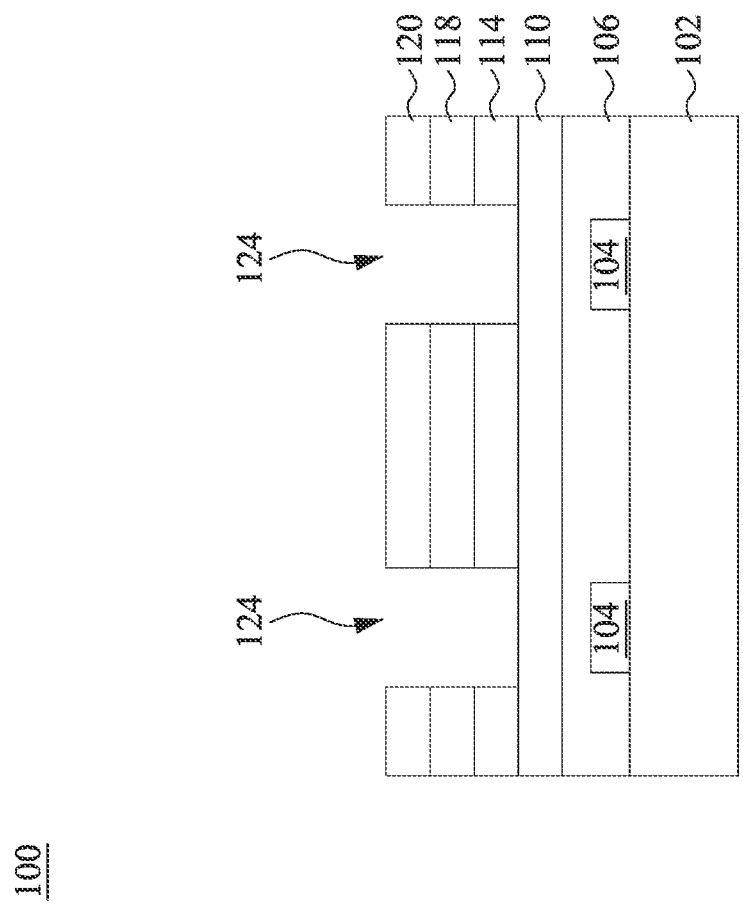
Figure 1E:
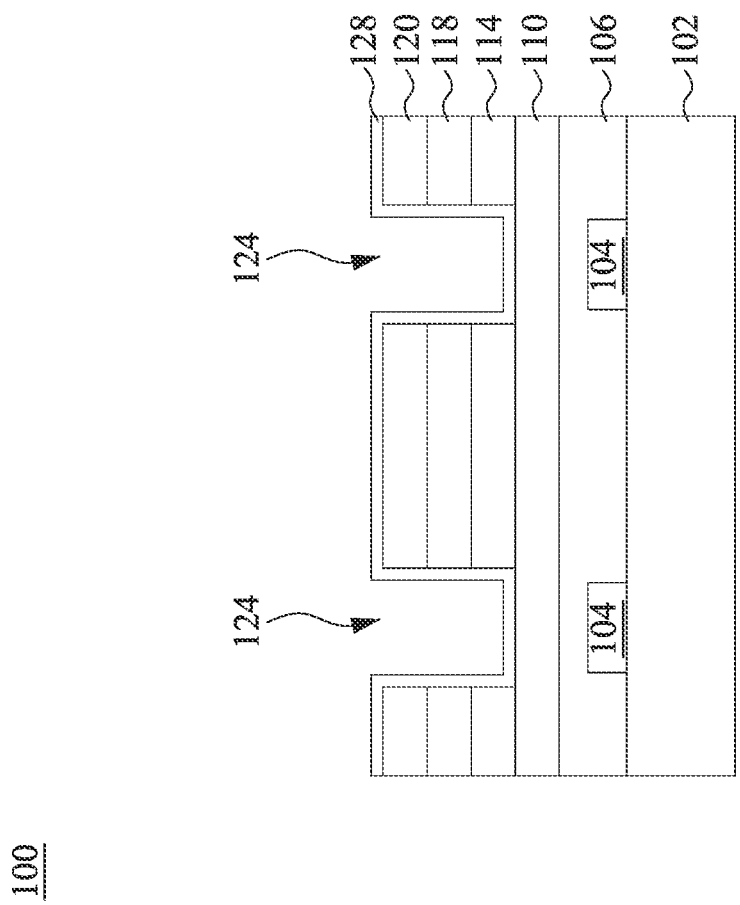
Figure 1F:
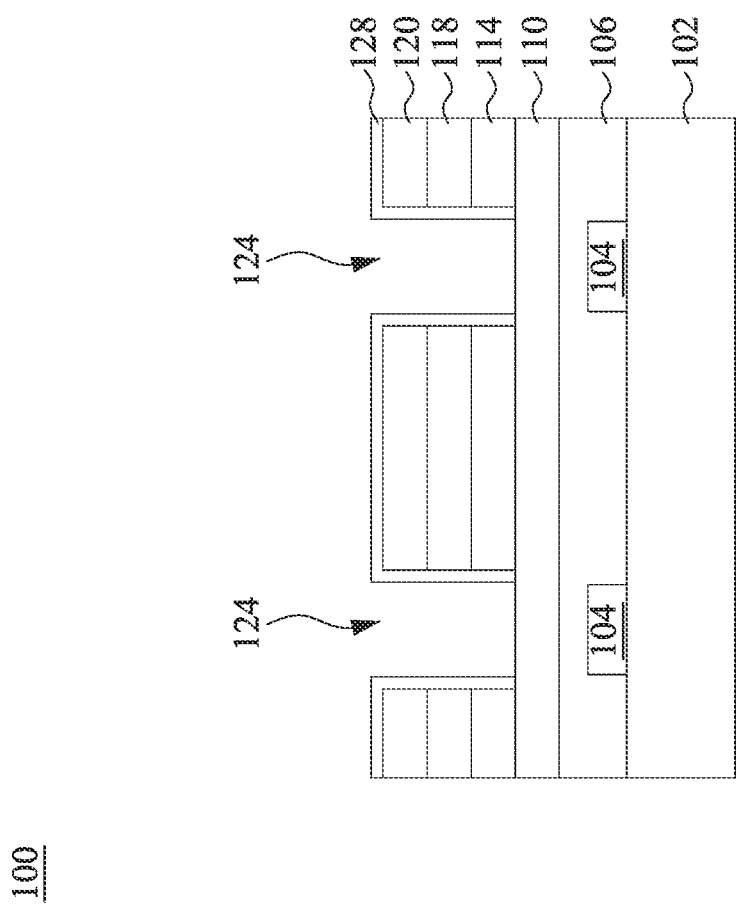
Figure 1G:
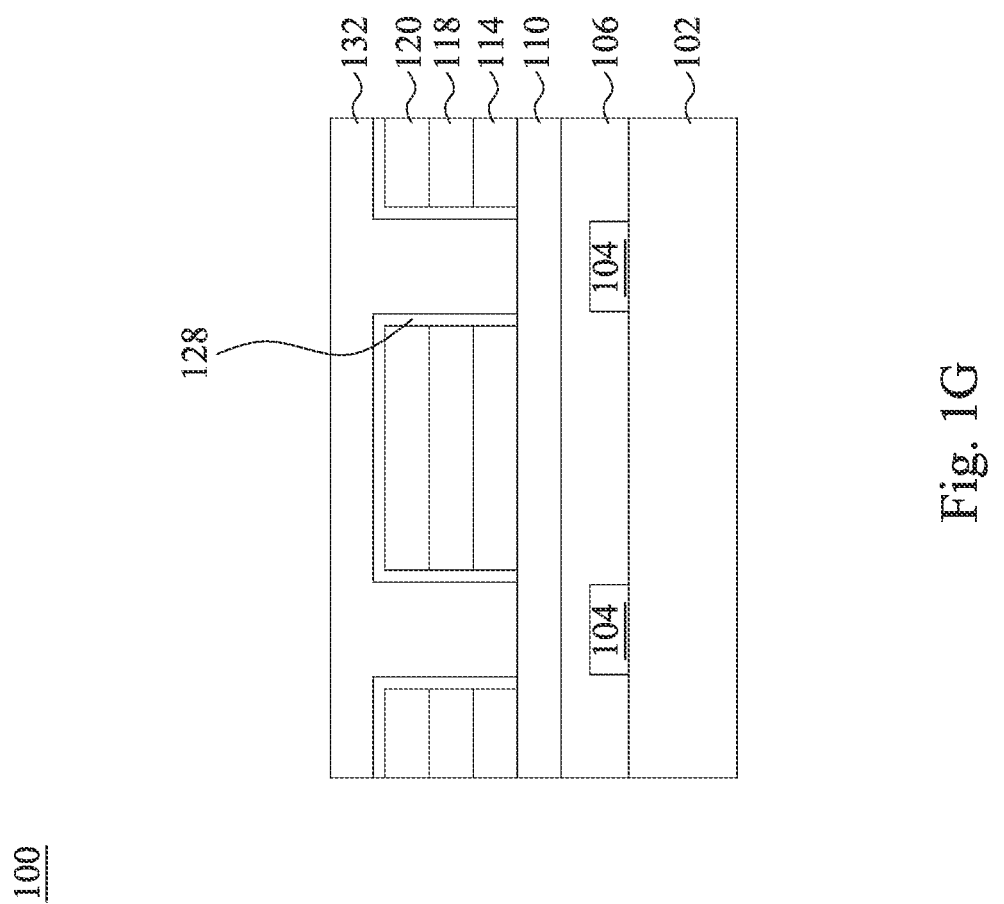
Figure 1I:
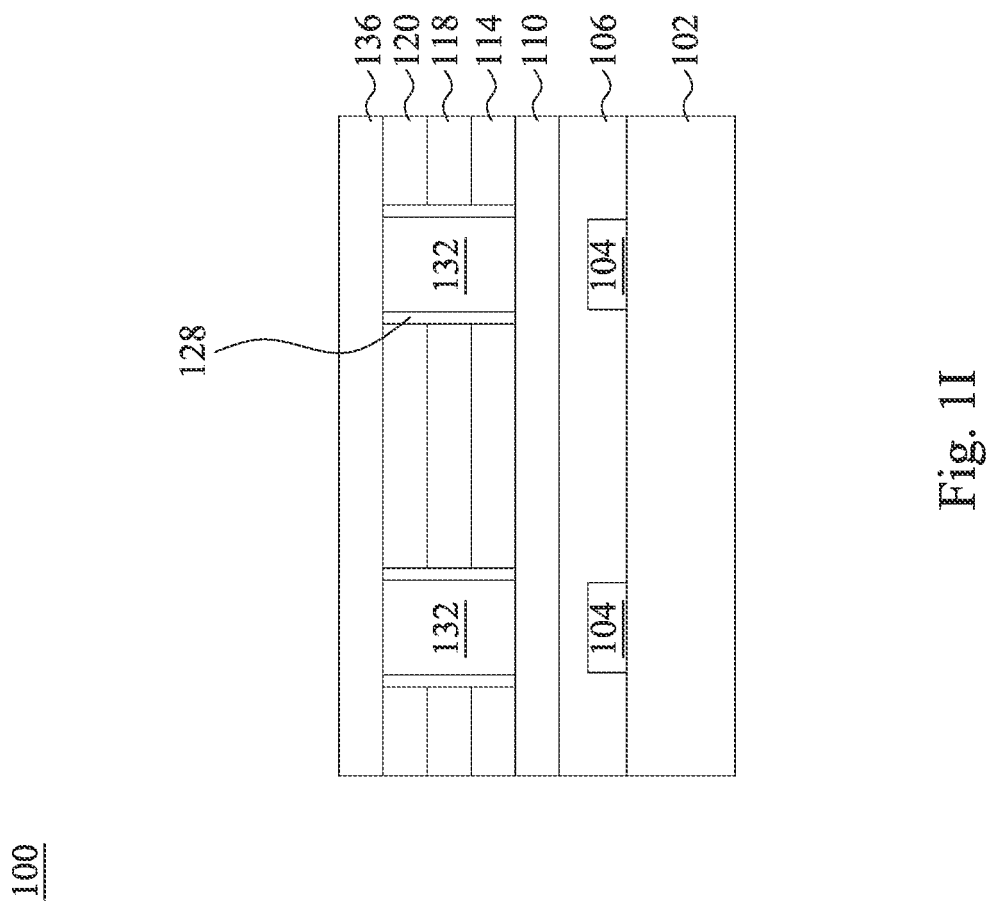
Figure 1J:
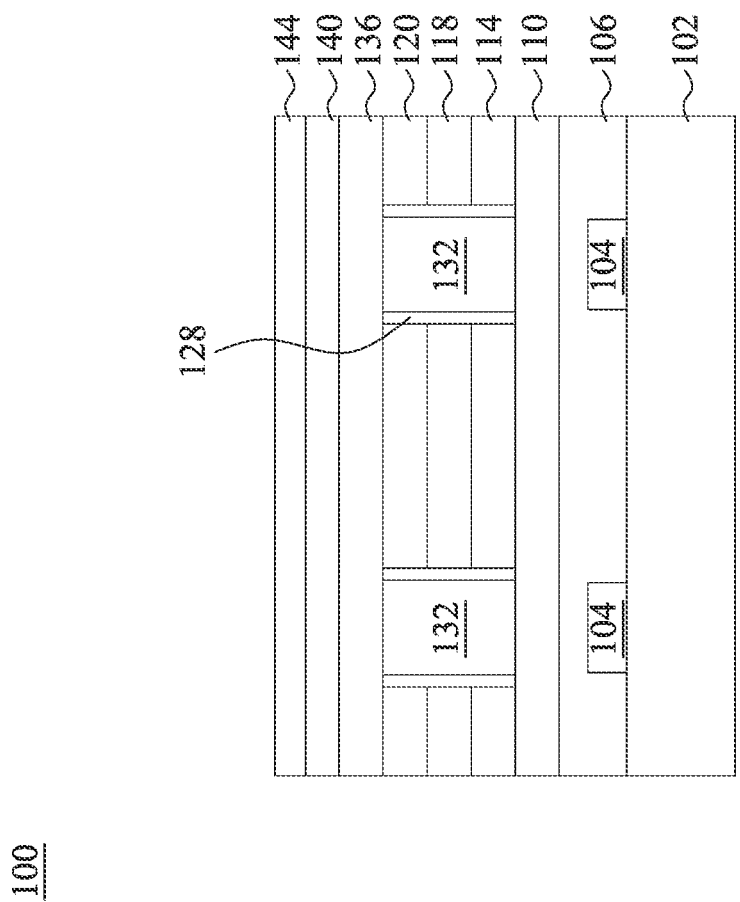
Figure 1K:
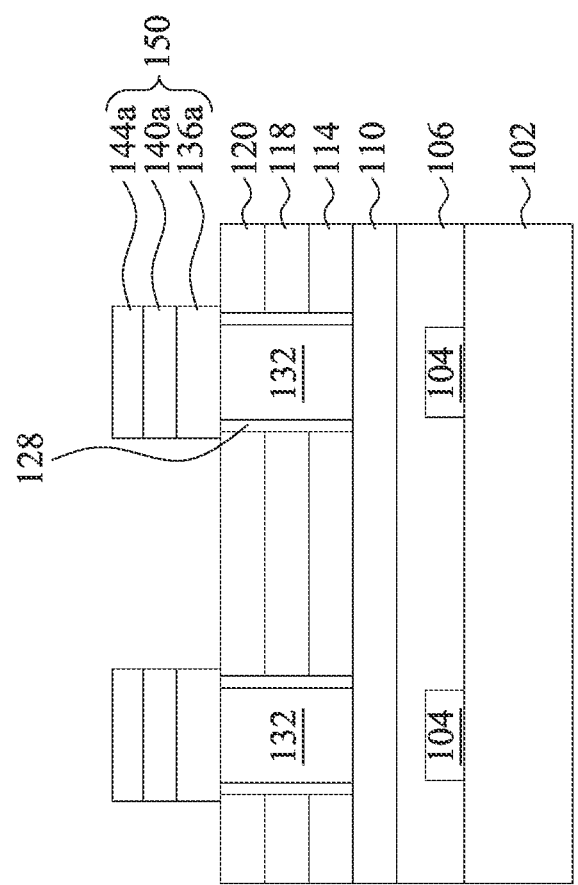
Figure 1L:
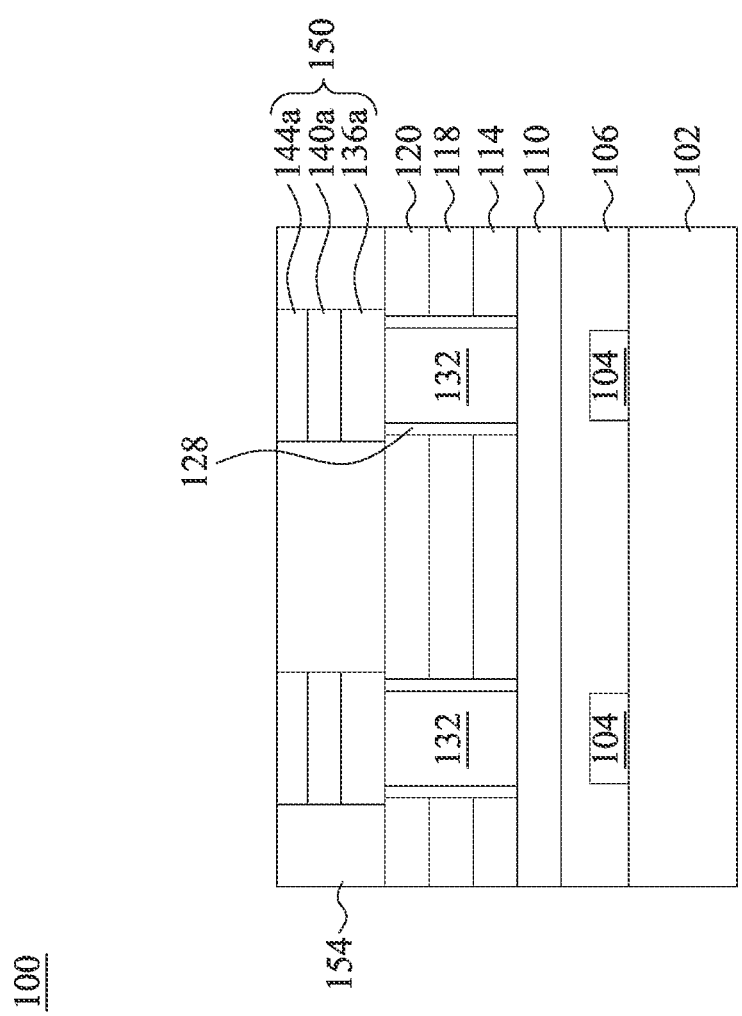
Figure 1M:
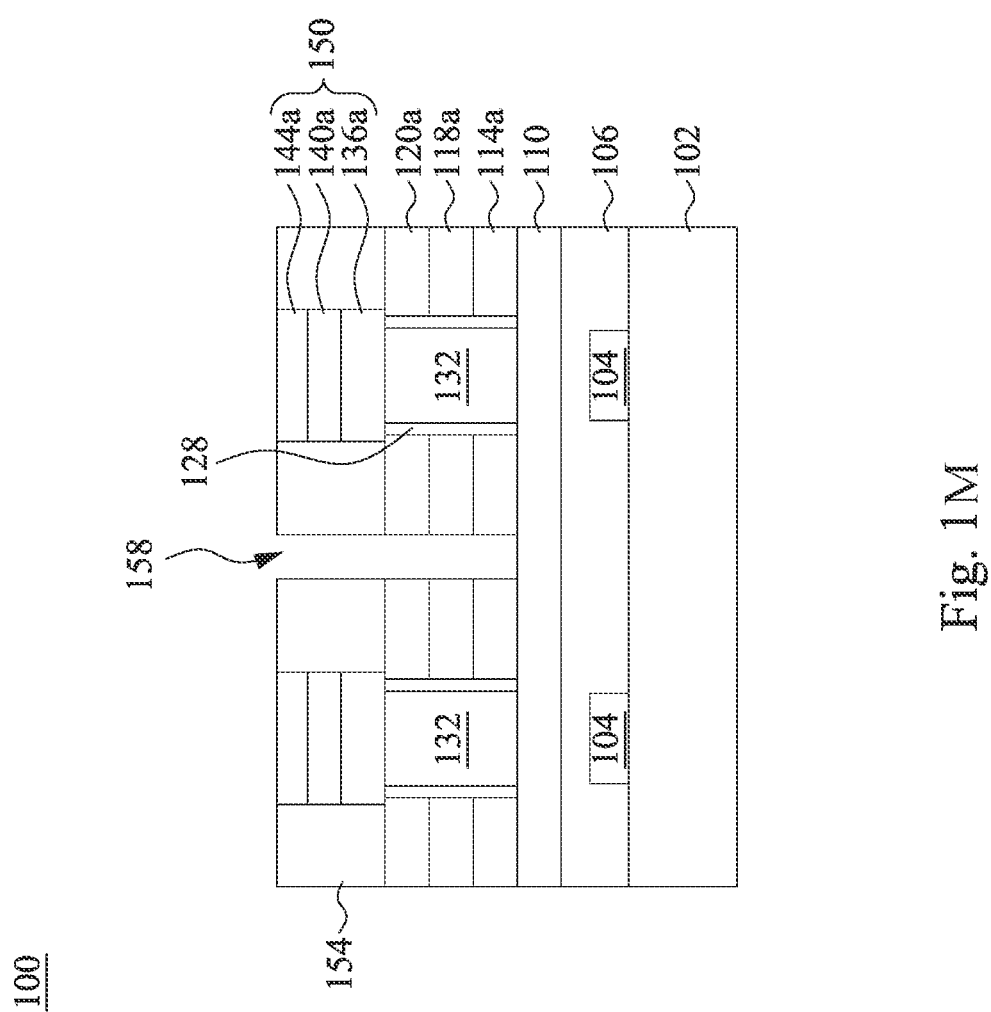
Figure 1N:
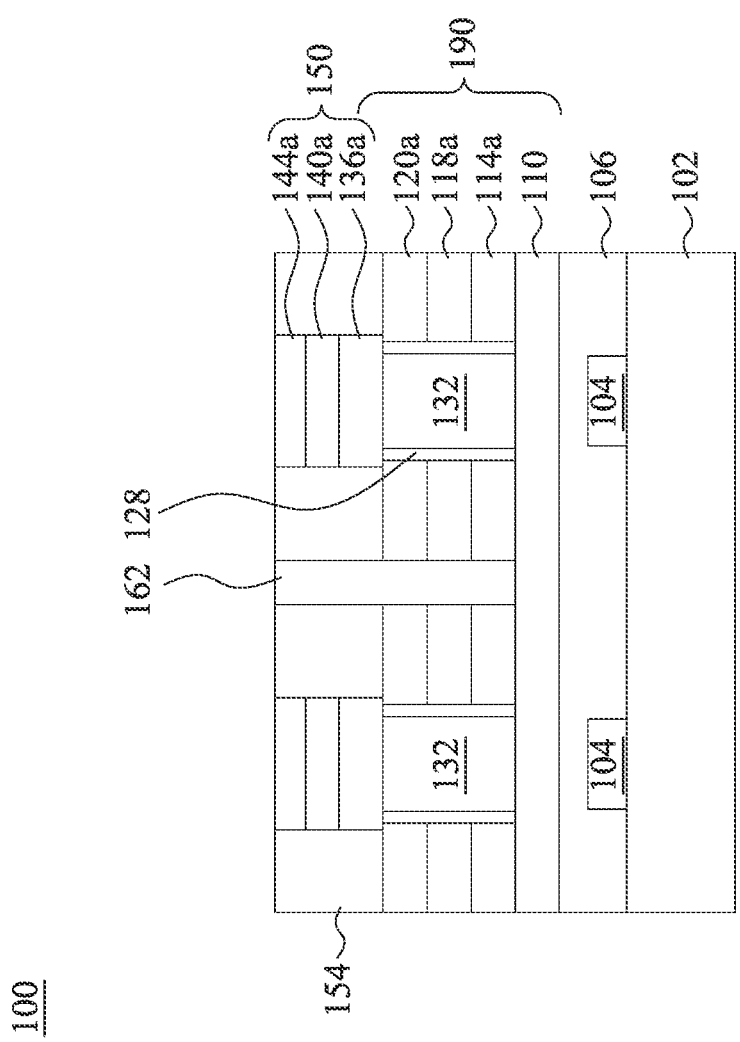
Figure 10:
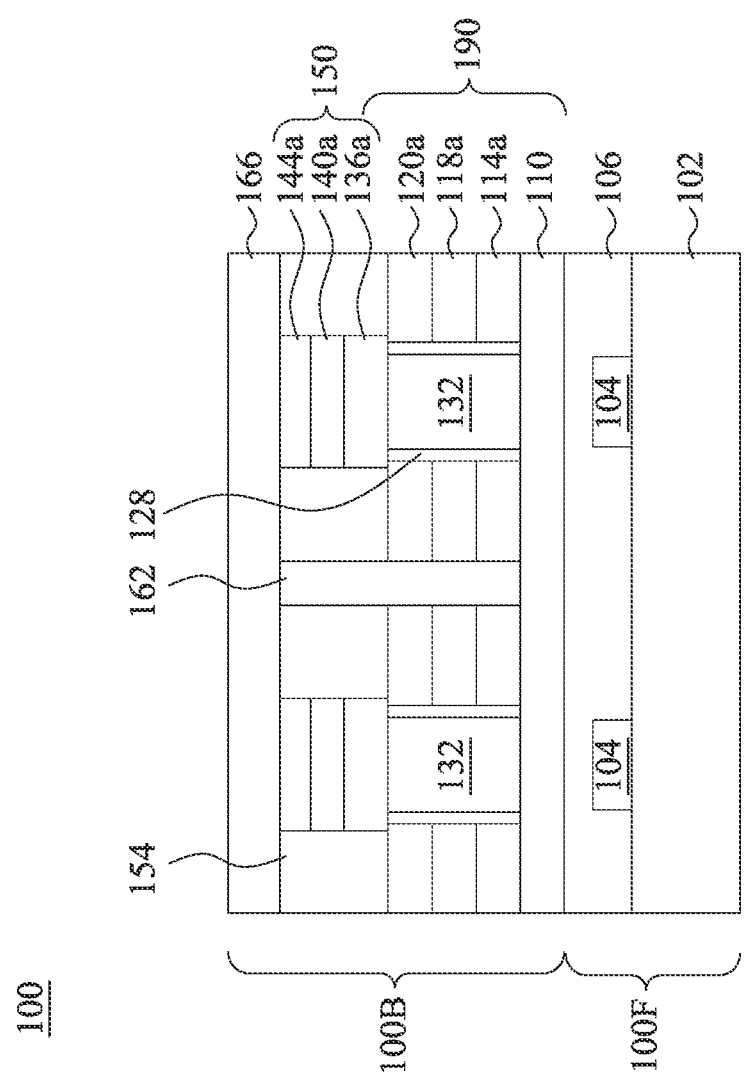
Figure 1P:
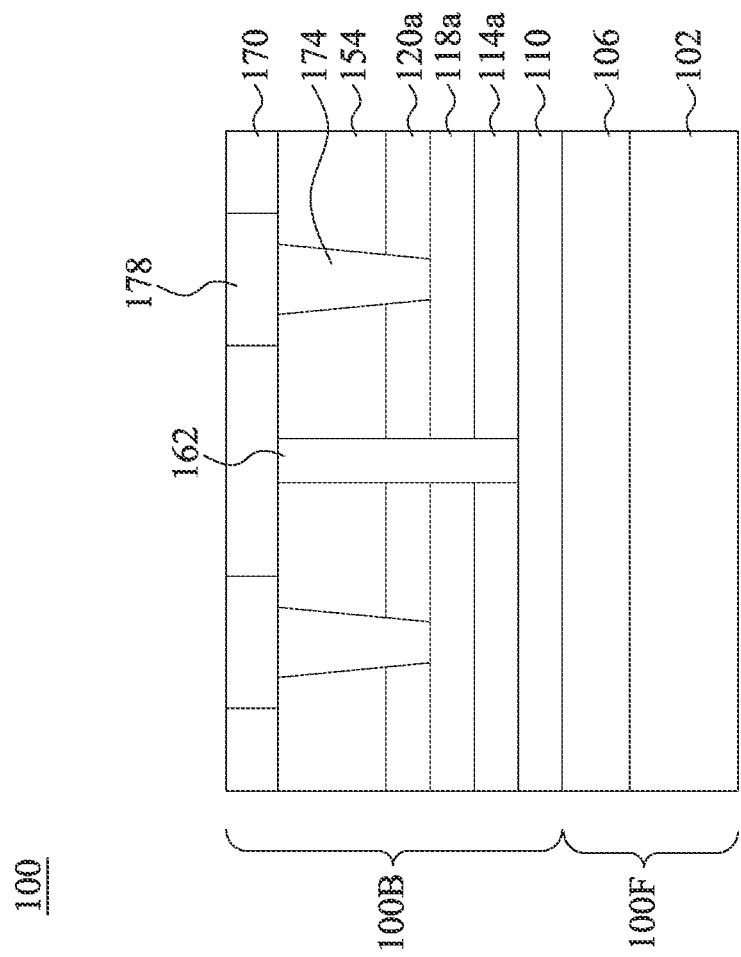
Figure 1Q:
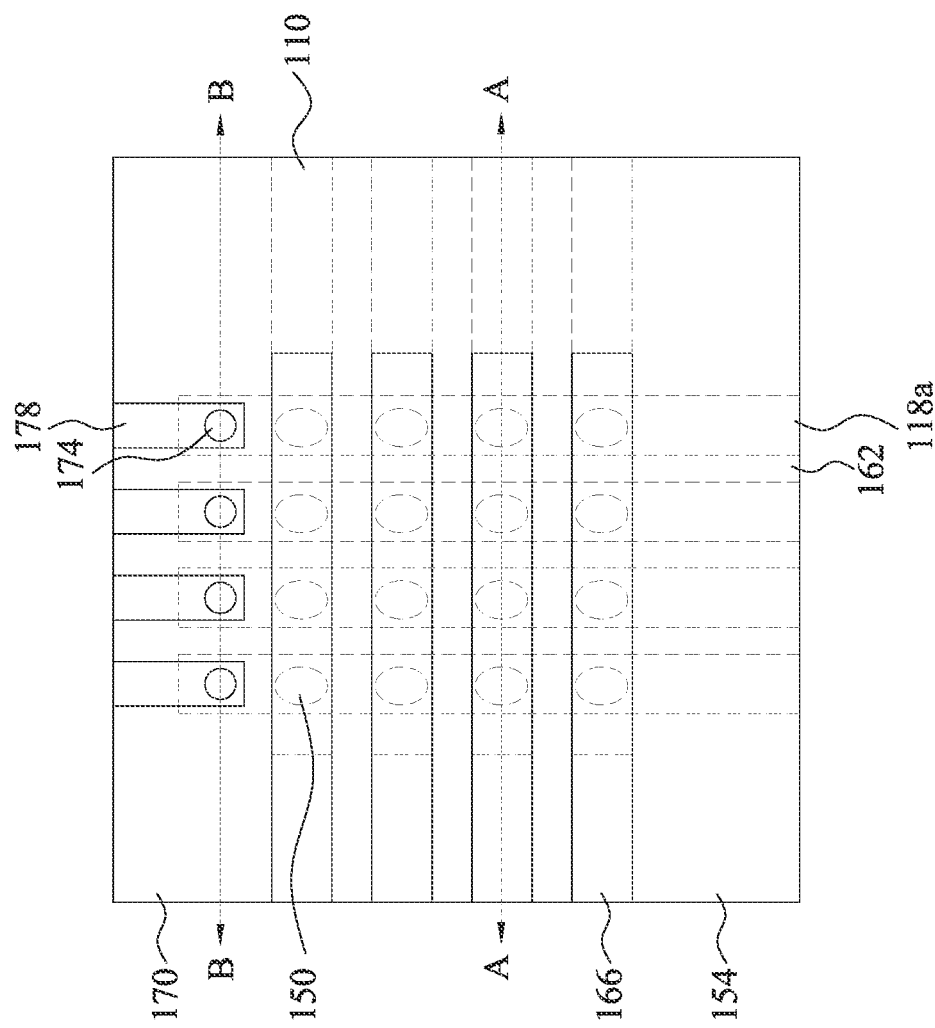
Figure 1R:
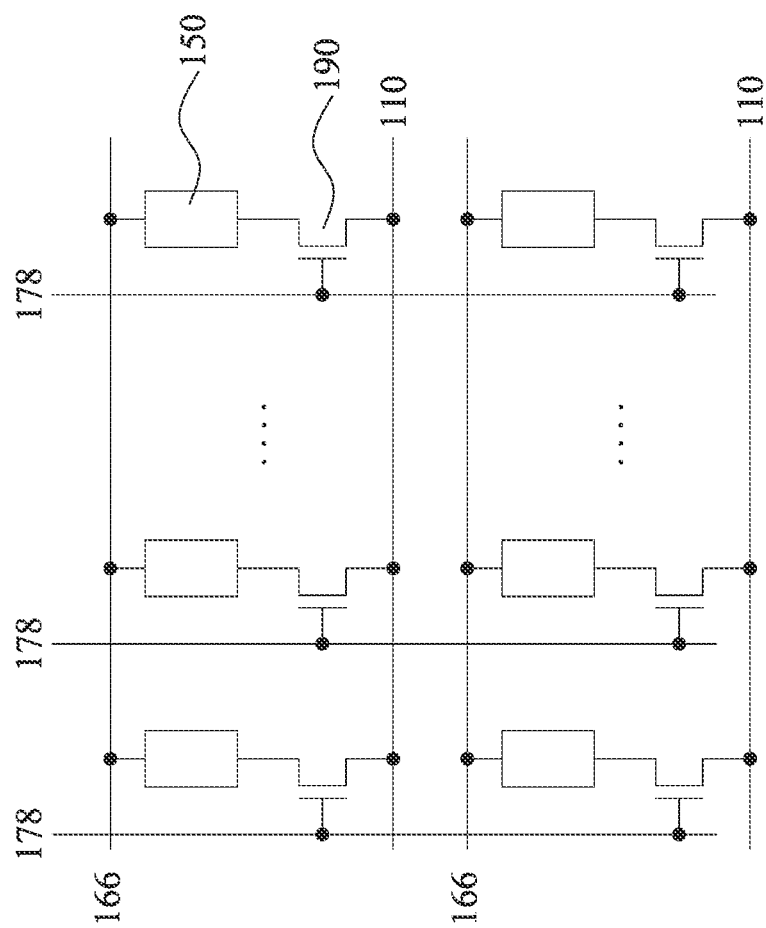

FIGS. 1A to 1R show exemplary cross-sectional and plan views of a portion of a semiconductor device 100 at intermediate stages in accordance with embodiments of the present disclosure. For example, FIG. 1R shows a plan view of a portion of the semiconductor device 100. The cross-sectional views in FIGS. 1A to 1P correspond to a portion of the cross-section labeled A-A in FIG. 1R. The cross-sectional view in FIG. 1Q corresponds to the cross-section labeled as B-B in FIG. 1R. It is understood that additional manufacturing steps can be provided before, during, and after processes shown by the Figures, and some of the manufacturing steps can be replaced or eliminated, for additional embodiments of the method. The order of the operations/processes may be interchangeable.

Referring to FIG. 1A, a FEOL portion 100F of the semiconductor device 100 is illustrated. The FOEL portion 100F includes a substrate 102. The substrate 102 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

A transistor array is formed over the substrate 102 and covered by the insulating layer 106, in accordance with some embodiments. The transistor array may be formed of transistors 104. In some embodiments, the transistors 104 are included in logic circuits, I/O circuits, ESD circuits, any other circuitry, or combinations thereof. The transistors 104 may include an n-type field effect transistor (n-FET) and a p-type field effect transistor (p-FET). In some embodiments, the transistors 104 are Fin FETs (FinFETs), gate-all-around FETs (GAA FETs), planar FETs, or combinations thereof. At least one of the transistors 104 may have a source electrode and a drain electrode laterally interposing a channel layer. For example, when the transistors 104 are FinFETs, a transistor 104 may include source and drain features disposed over respective sides of a fin.

The FEOL portion 100F may further include an insulating layer 106 formed over a substrate 102, in accordance with some embodiments. In some embodiments, the insulating layer 106 includes one or more sub-layers. The insulating layer 106 may include silicon oxide, silicon oxynitride, silicon nitride, a spin-on dielectric material, or a low-k dielectric such as porous silicon oxide or other suitable dielectric materials having a dielectric constant lower than about 3.9. The insulating layer 106 may be formed by flowable CVD (FCVD) (e.g., a CVD-based material that can flow during deposition to fill gaps and spaces with a high aspect ratio and convert to an oxide by curing), high-density plasma chemical vapor deposition (HDP-CVD), sub-atmospheric CVD (SACVD), other suitable CVD techniques, atomic layer deposition (ALD), spin coating, or combinations thereof. In some embodiments, the transistors 104 are electrically separated from each other by the insulating layer 106.

After the formation of FEOL portion 100F, proceed steps of manufacturing a BEOL portion 100B (see FIG. 1P) of the semiconductor device 100. For example, referring to FIG. 1B, conductive lines 110 are formed over the insulating layer 106 and extend along a first direction (e.g., the X-direction shown in FIG. 1R). The conductive lines 110 may include a conductive layer over a barrier layer, over a glue layer such as Ti/TiN/TaN, or a combination of all. In an embodiment, the conductive layer of the conductive lines 110 may include a metal material such as Ru, Ta, Ti, Al, TiN, W, Cu, the like, alloys thereof, or combinations thereof. In some embodiments, the barrier layer includes Ta, Ti, Pt, other noble metals, other refractory metals, their nitrides, or combinations thereof. In an embodiment, the conductive lines 110 are formed in a dielectric layer (or referred to as inter-layer dielectric (ILD) layer, not shown in figures). The ILD layer may be made of a material including Si, O, C, and/or H, such as silicon oxide, SiCOH, SiOC, and SiOCN, low-k material, organic material, any other suitable dielectric material, or combinations thereof. In some embodiments, the conductive lines 110 provide source lines of the subsequently formed memory cells.

In some embodiments, the conductive lines 110 are formed by first depositing the ILD layer and patterning the ILD layer to form openings (e.g., using suitable lithography and etching processes), and filling the openings in the ILD layer with the barrier layer and the conductive layer. In other embodiments, the conductive lines 110 are formed by first depositing the barrier layer and the conductive layer; patterning the barrier layer and the conductive layer to the conductive lines 110; and filling the space between adjacent conductive lines 110 with the ILD layer. In any embodiments above, after the conductive layer and the ILD layer are deposited, a planarization process, such as chemical mechanical planarization (CMP), is performed to remove excess portions of the conductive layer over the dielectric layer or expose the conductive lines 110 from the ILD layer. The conductive layer or the barrier layer may be deposited by physical vapor deposition (PVD), CVD, ALD, e-beam evaporation, or other suitable processes. The ILD layer may be formed by any CVD technique, spin coating, or combinations thereof.

Referring to 1C, a dielectric layer 114, a gate electrode layer 118, and a dielectric layer 120 are deposited over the conductive lines 110. In an embodiment, the dielectric layer 114 and 120 include a material including Si, O, C, N, and/or H, such as silicon oxide, SiCOH, SiOC, SiOCN, SiON, SiN, low-k material, organic material, any other suitable dielectric material, or combinations thereof. In some embodiments, the dielectric layer 114 and the dielectric layer 120 may each have a thickness of about 0.2 nm to about 5 nm. The dielectric layers 114 and 120 may be deposited by any CVD technique, PVD, spin coating, or combinations thereof.

In some embodiments, the gate electrode layer 118 may be formed of a conductive material such as Ru, Ta, Ti, Al, TiN, W, alloys thereof, the like, or combinations thereof. The gate electrode layer 118 may be deposited by, PVD, any CVD technique, ALD, e-beam evaporation, other suitable processes, or combinations thereof. In some embodiments, the gate electrode layer 118 has a thickness T of about 0.1 nm to about 10 nm.

Referring to FIG. 1D, openings 124 are formed in the dielectric layer 120, the gate electrode layer 118, and the dielectric layer 114, in accordance with some embodiments. The openings 124 may be formed by one or more lithography and etching processes. For example, in an embodiment, a photoresist layer is applied over the dielectric 124 and patterned by lithography. Portions of the dielectric layer 120, the gate electrode layer 118, and the dielectric layer 114 not covered by the patterned photoresist layer are etched by one or more anisotropic etching processes, such as a reactive ion etch (RIE) or an ion beam etch (IBE). The anisotropic etching process may include using various suitable gases for etching different layers. In some embodiments, the openings 124 are at least partially aligned to and expose the conductive lines 110. The openings 124 may have an approximately circular shape or may have an oblong shape, such as an elliptical shape, rounded rectangle shape, or the like. In some embodiments, the openings 124 have a diameter or a long axis of about 10 nm to about 100 nm.

Referring to FIG. 1E, a gate dielectric layer 128 is conformally formed in the opening 124 and over dielectric layer 120, in accordance with some embodiments. In some embodiments, the gate dielectric layer 128 includes a high-k dielectric layer such as $HfO_2$, HfSiO, HfSiON, HfTaO, HfTiO, HfZrO, zirconium oxide, aluminum oxide, titanium oxide, hafnium oxide-alumina (HfO$_2$—Al$_2$O$_3$) alloy, Ta$_2$O$_3$, La$_2$O$_3$, HfO$_2$—La$_2$O$_3$, Y$_2$O$_3$, other suitable high-k dielectric material, or combinations thereof. The gate dielectric layer 128 may be formed by ALD or any suitable CVD technique. In some embodiments, the gate dielectric layer 128 has a thickness of about 0.5 nm to about 20 nm.

Referring to FIG. 1F, a bottom portion of the gate dielectric layer 128 is removed by an etching process, and the conductive lines 110 are exposed, in accordance with some embodiments. In some embodiments, the etching process is anisotropic and includes reactive ion etch (RIE) or ion beam etch (IBE) and is configured to etch the gate dielectric layer 128 vertically with minimum lateral etching. The gate dielectric layer 128 over the dielectric layer 120 may be partially or completely removed in the etching process.

Referring to FIG. 1G, a channel layer 132 is formed over the gate dielectric layer 128 and fills the openings 124, in accordance with some embodiments. In some embodiments, the channel layer 132 includes an oxide semiconductor having a bandgap higher than that of silicon. For example, the channel layer 132 may have a bandgap of about 2 eV to about 4 eV. In some embodiments, the channel layer 132 includes indium oxide (In$_2$O$_3$), indium zinc oxide (IZO), zinc tin oxide (ZTO), indium gallium oxide (IGO), indium tungsten oxide (IWO), indium gallium zinc oxide (IGZO), tin oxide (SnO$_2$), nickel oxide (NiO) copper oxide (Cu$_2$O), zinc oxide (ZnO), the like, or combinations thereof. The channel layer 132 may be formed by any suitable CVD technique, PVD, or combinations thereof.

Referring to FIG. 1H, excess portions of the gate dielectric layer 128 and the channel layer 132 are removed by a planarization process such as by CMP, in accordance with some embodiments. For example, portions of the gate dielectric layer 128 and the channel layer 132 over the dielectric layer 128 may be removed. After the planarization process, the resulting gate dielectric layer 128 has a ring shape in each opening 124 in a plan view, and the resulting channel layer 132 has a pillar shape in each opening 124, in accordance with some embodiments.

In FIGS. 1I and 1J, memory stack layers are deposited over the channel layer 132 and the dielectric layer 120, in accordance with some embodiments. In an embodiment, the memory stack layers include a bottom electrode layer 136, a memory layer 140, and a top electrode layer 144. Referring to FIG. 1I, a bottom electrode layer 136 of the memory stack layers is deposited. In an embodiment, the bottom electrode layer 136 is deposited over the dielectric layer 120 and the channel layer 132 using one or more suitable techniques such as CVD, ALD, PVD, sputtering, plating, the like, or combinations thereof. In some embodiments, the bottom electrode layer 136 is formed of multiple layers of material. The bottom electrode layer 136 may include Cu, Al, Ti, Ta, W, Pt, Ni, Cr, Ru, Co, Co$_x$Fe$_y$B$_z$W$_w$, TiN, TaN, the like, combinations thereof, or multiple layers thereof. For example, the bottom electrode layer 136 may include a tantalum nitride layer, and a titanium nitride layer formed over the tantalum nitride layer.

Next, in FIG. 1J, the memory layer 140 of the memory stack layers is deposited over the bottom electrode layer 136 using one or more suitable techniques such as CVD, ALD, PVD, sputtering, plating, the like, or combinations thereof. In some embodiments, the memory layer 140 includes a resistive material. The resistive material may be made of metal oxides, such as NiOx, WOx, HfOx, ZnOx, TiOx, TaOx, FeOx GeOx, AlOx, NbOx, GdOx, CeOx, ZrOx, CuOx, CuSiOx, PrCaMnOx, or combinations thereof, where the x can be the number of oxygen corresponding to the highest oxidation state of metal or a lower oxidation state of the metal. In other embodiments, the memory layer includes other resistive materials such as TiON, Ag—GeSe, Cu—GeSe, or combinations thereof.

In some embodiments, the memory layer 140 includes a binary phase change material, such as GeSb, InSb, InSe, SbTe, GeTe, and/or GaSb; a ternary system, such as GeSbTe, InSbTe, GaSeTe, SnSbTe, InSbGe, and/or GaSbTe; or a quaternary system, such as GeSnSbTe, GeSbSeTe, TeGeSbS, GeSbTeO, and/or GeSbTeN. In certain embodiments, the phase change material is a GeSbTe alloy (e.g., Ge$_2$Sb$_2$Te$_5$) with or without nitrogen doping and/or silicon oxide.

In other embodiments, the memory layer 140 is a multi-layer structure, e.g., including a magnetic tunnel junction (MJT) structure, which may include a stack of a barrier layer sandwiched by a free layer and a reference layer. Whether the memory layer 140 is in a high-resistance state or a low-resistance state depends on the relative orientations of the spin polarization of the free layer and the reference layer. The free layer may be formed of one or more ferromagnetic materials, such as one or more layers of CoFe, NiFe, CoFeB, CoFeBW, Ru, alloys thereof, the like, or combinations thereof. In some embodiments, the barrier layer is formed of one or more materials such as MgO, AlO, AlN, the like, or combinations thereof. The reference layer may be formed of a ferromagnetic material, such as one or more layers of CoFe, NiFe, CoFeB, CoFeBW, alloys thereof, the like, or combinations thereof.

In some embodiments, the memory layer 140 also includes a synthetic antiferromagnet (SAF) layer coupled to the MJT structure through a spacer layer. The SAF layer may provide an antiferromagnetic coupling to pin the spin polarization direction of the reference layer in a fixed direction, where the coupling strength may be determined by the thickness of the spacer layer. Pinning the spin polarization direction of the reference layer allows the memory layer 140 to be toggled between a low-resistance state and a high-resistance state by changing the spin polarization direction of the free layer relative to the reference layer. In some embodiments, the spacer layer is formed of a material such as W, Mo, the like, or combinations thereof. The SAF layer may include multiple layers of different materials, in some embodiments. For example, the SAF layer may include a stack of one or more ferromagnetic layers and one or more non-magnetic layers. For example, the SAF layer may be formed from a non-magnetic layer sandwiched between two ferromagnetic layers or a stack of alternating non-magnetic layers and ferromagnetic layers. The ferromagnetic layers may be formed of a material such as Co, Fe, Ni, CoFe, NiFe, CoFeB, CoFeBW, alloys thereof, the like, or combinations thereof. The non-magnetic layers may be formed of a material such as Cu, Ru, Ir, Pt, W, Ta, Mg, the like, or combinations thereof.

In some embodiments, the memory layer 140 further includes a spin-orbit torque (SOT) layer formed over the free layer of the MJT stack. The SOT layer may be formed of heavy metal or a metal alloy, such as W, Ta, Pt, Au, Pt, W$_3$Ta, Bi$_x$Se$_y$, BiSeTe, multi-layers thereof, alloys thereof, the like, or combinations thereof. In some embodiments, the SOT layer acts as a generator of a spin polarized current. By conducting a current through the SOT layer, spin polarized currents are generated in transverse directions, and these spin polarized currents are used to control the magnetic moment of the free layer of the MJT structure.

After the memory layer 140 is deposited, the top electrode layer 144 of the memory stack layers is deposited over the memory layer 140 using one or more suitable techniques such as CVD, ALD, PVD, sputtering, plating, the like, or combinations thereof. The top electrode layer 144 may include one or more layers of materials such as Cu, Al, Ti, Ta, W, Pt, Ni, Cr, Ru, Co, Zr, TiN, TaN, the like, combinations thereof, or multiple layers thereof. For example, the top electrode layer 144 may include a Ru layer and a Ta layer formed over the Ru layer. In some cases, the top electrode layer 144 may be considered a "capping layer," or one or more layers within the top electrode layer 144 may be considered "capping layers."

Referring to FIG. 1K, a patterning process is performed to pattern the bottom electrode layer 136, the memory layer 140, and the top electrode layer 144 to form individual memory stacks 150 (e.g., including a bottom electrode 136a, a memory element 140a and a top electrode 144a), in accordance with some embodiments. The patterning process may include one or more suitable lithography and etching processes. For example, a photoresist is applied over the top electrode layer 144 and then patterned by one or more lithography processes. Portions of the layers of memory stacks not covered by the patterned photoresist may be etched by one or more anisotropic etching processes. The one or more anisotropic etching process may include an RIE process or an IBE process, using various suitable gases for etching different layers in the layers of memory stacks. The memory stacks 150 may each have an approximately circular shape, or oblong shapes, such as an elliptical shape, rounded rectangle shape, or the like. In some embodiments, the memory stacks 150 have a size bigger or substantially the same as that of the openings 124. For example, in some embodiments, the memory stacks 150 have a diameter or a long axis of about 10 nm and about 500 nm. The memory stacks 150 may have an area of about 100 nm$^2$ to about 250000 nm$^2$. In some embodiments, the memory stacks 150 form a memory array of memory cells.

Referring to FIG. 1M, a dielectric layer 154 is formed over the memory stacks 150 and the dielectric layer 120, in accordance with some embodiments. In an embodiment, portions of the dielectric layer 154 over the memory stacks 150 are removed by a planarization process such as CMP, exposing the memory stacks 150. The dielectric layer 154 may include a material similar to those described above for the insulating layer 106 and may be formed by similar methods.

Referring to FIG. 1N, openings 158 are formed in the dielectric layer 120, the gate electrode layer 118, and the dielectric layer 114 and form select transistors 190 of memory cells, in accordance with some embodiments. In some embodiments, the openings 158 are formed between two adjacent memory stacks 150. For example, referring to FIG. 1R, the openings are disposed where a filling material 162 (which will fill the openings 158 later) will be subsequently deposited. In some embodiments, the openings 158 (i.e., the filling material 162) extend along a direction (e.g., the Y-direction in FIG. 1R) that is substantially perpendicular to the conductive lines 110. For example, the openings 158 (i.e., the filling material 162) extend through and separate the gate electrode layer into discrete sections to define gate electrodes 118a (e.g., the strips 118a shown in FIG. 1R). The gate electrodes 118a may surround and encircle a sidewall of the gate dielectric layer 128 and a sidewall of the channel layer 132 in a plan view. In some embodiments, the openings 158 may extend through the dielectric layer 120 and the dielectric layer 114 to define spacers 120a and 114a. The spacers 120a and 114a may have substantially the same shape as the gate electrodes 118a in a plan view. For example, the spacers 120a and 114a interpose the gate electrodes 118a vertically and wrap around the gate dielectric material 128 and the channel layer 132 laterally.

In some embodiments, each of the select transistors 190 includes the channel layer 132 which is encircled by the gate dielectric layer 128 and the gate electrode 118a. The channel layer 132 may be interposed by the conductive line 110 and the bottom electrode 136a (e.g., functioning as source/drain electrodes). The bottom electrodes 136a may function as both electrodes of memory stacks 150 and drain electrodes of the select transistors 190. In some embodiments, the select transistors 190 are junctionless transistors having vertical channels, which extend between a first source/drain electrode (e.g., a portion of the conductive line 110) and a second source/drain electrode (e.g., a portion of the bottom electrode 136a). The openings 158 may be formed by etching the dielectric layer 120, the gate electrode layer 118, and the dielectric layer 114 by an etching process. The etching process may be anisotropic and may include an RIE process or an IBE process, with using various suitable gases to etch different layers.

Referring to FIG. 1O, a filling material 162 is deposited to fill the openings 158, in accordance with some embodiments. For example, the filling material 162 may include a material similar to those described above for the dielectric layer 114, the dielectric layer 120, or the dielectric layer 154 and may be formed using similar methods. In some embodiments, the filling material 162 is made of the same material as the dielectric layer 154. In some embodiments, after deposition, excess portions of the filling material 162, such as portions of the filling material 162 over the dielectric layer 154, are removed by a planarization process such as CMP for exposing the top surface of the memory stacks 150.

Referring to FIG. 1P, conductive lines 166 are formed over the dielectric layer 154 and the filling material 162 and in contact with the memory stacks 150, in accordance with some embodiments. In an embodiment, the conductive lines 166 are formed in a dielectric layer 170 (e.g., referring to FIG. 1R). In some embodiments, the conductive lines 166 are formed by a damascene process. The conductive lines 166 may be formed of a material similar to those described above for conductive lines 110 and may be formed by similar methods. In an embodiment, the conductive lines 166 extend in a direction (e.g., extending along the X-direction shown in FIG. 1R) that is substantially parallel to the conductive lines 110 or substantially perpendicular to the gate electrodes 118a. In some embodiments, the conductive lines 166 provide bit lines of memory cells.

Figure 1S:
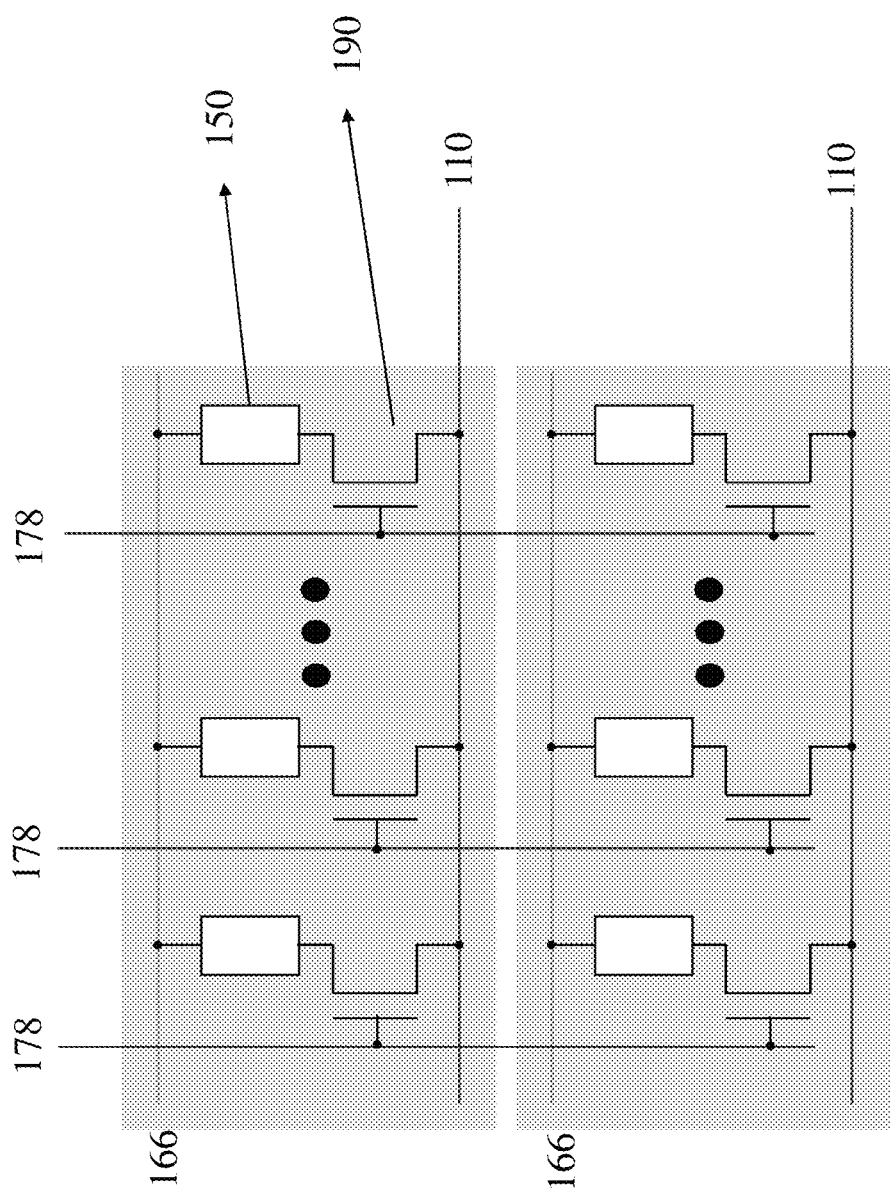

Referring to FIG. 1Q (showing a cross-sectional view along a portion of the section labeled as B-B in FIG. 1S), vias 174 and conductive lines 178 are formed, in accordance with some embodiments. The vias 174 may be in contact with the gate electrodes 118a for making electrical connections between the conductive lines 178 and the gate electrodes 118a. In some embodiments, the conductive lines 178 and the conductive lines 166 (see FIG. 1P) are formed in the same dielectric layer, such as the dielectric layer 170 illustrated in FIG. 1Q. For example, in such embodiments, the vias 174 are formed in the spacer 120a and the dielectric layer 154, and the conductive lines 166 and 178 are formed in the dielectric layer 170. However, in other embodiments, the conductive lines 178 and the conductive lines 166 are formed in different dielectric layers. For example, in such embodiments, the conductive lines 178 are formed in an upper-level dielectric layer above the dielectric layer 170, and the vias 174 extend through the spacer 120, the dielectric layer 154, and the dielectric 170 for making electrical connections between the conductive lines 178 and the gate electrodes 118. The conductive lines 178 may be formed of a material similar to those described above for conductive lines 110. The vias 174 and the conductive lines 178 may be formed by PVD, CVD, ALD, or other suitable methods. In an embodiment, the conductive lines 178 extend in a direction (e.g., along the Y-direction shown in FIG. 1R) that is substantially perpendicular to the conductive lines 110 or substantially parallel to the gate electrodes 118a. Additionally, to form the vias 174, openings may be defined through the relevant layers by, for example, suitable photolithography and etching processes, and the openings may then be filled with a conductive material to form the vias 174. In some embodiments, the conductive lines 178 provide word lines of memory cells.

In some embodiments, the vias 174 and the conductive lines 178 are formed by a single damascene process or a dual damascene process. For example, when vias 174 and the conductive lines 178 are formed by a single damascene process, the vias 174 may be formed first, and the conductive lines 166 and 178 are then formed in the dielectric layer 170 in the same or different deposition processes. When vias 174 and the conductive lines 178 are formed by a dual damascene process, the vias 174 and the conductive lines 178 may be formed together (e.g., in the same deposition process), and the conductive lines 166 may be formed before or after the formation of the vias 174 and the conductive lines 178.

One or more sets of additional vias and conductive lines (not shown in Figures) may be formed over the conductive lines 178. The additional sets of vias and conductive lines may be formed in a similar manner as the vias 174 and the conductive lines 178. In some embodiments, bonding pads and bumps (not shown in Figures) are also formed over the additional sets of vias and conductive lines to complete the BEOL portion 100B.

The embodiments of the present disclosure have some advantageous features. For example, the select transistors 190 are integrated with the memory array formed of the memory stacks 150 to form memory cells in the BEOL portion 100B. The memory array and the select transistors 190 realize 1T1R (one transistor and one resistive) type memory cells in the BEOL portion 100B. For example, referring to an equivalent circuit of the 1T1R memory cells as shown in FIG. 1S, each memory stack 150 is operatively connected to a side of a transistor 190. The 1T1R memory cells can be operated by applying various voltages to source lines 110, bit lines 166, and word lines 178. Accordingly, the select transistors 190 can be formed above logic circuits, I/O circuits, and ESD circuits in the FEOL portion 100A, instead of being formed with them in the same horizontal plane. As a result, the footprint of the memory cells can be reduced. It is understood, although only 1T1R type memory cell structures are illustrated in the embodiments described above, other type memory cell structures, such as 2T1R type memory cell structures or other variations, can be also considered within the scope of the present disclosure.

FIGS. 2A to 2E illustrate exemplary cross-sectional views of a semiconductor device 200 at intermediate stages in accordance with some embodiments of the present disclosure. In certain embodiments, the semiconductor device 200 is the same as the semiconductor device 100 except for the details described below.

Figure 2A:
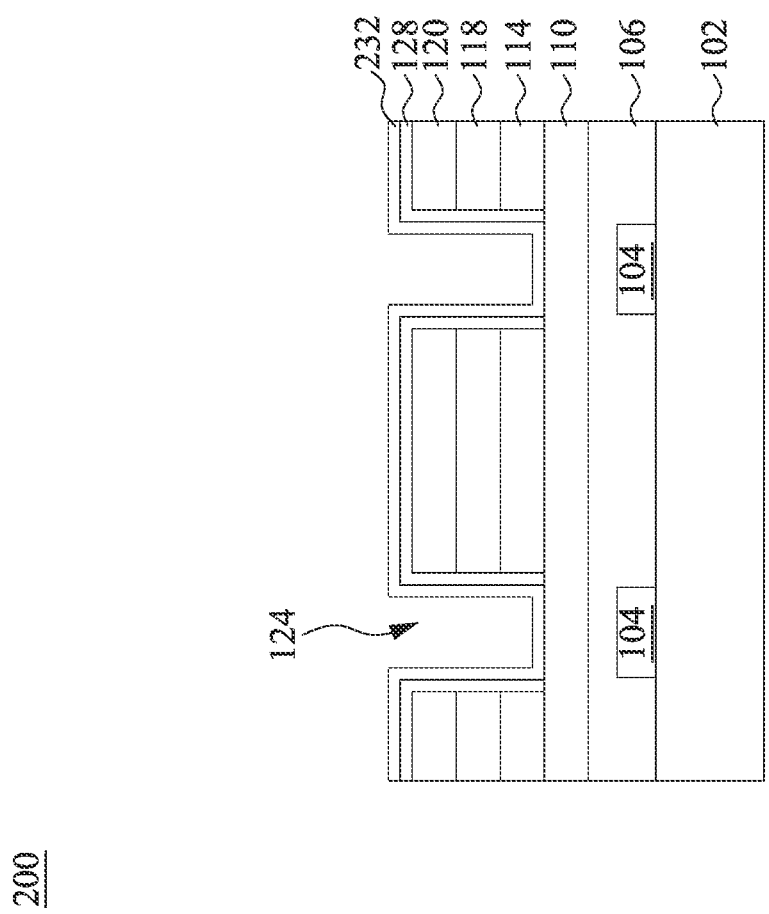
FIGS. 2A to 2E show exemplary cross-sectional views of a semiconductor device at intermediate stages in accordance with embodiments of the present disclosure.

Referring to FIG. 2A, after the gate dielectric layer 128 is formed over a sidewall of the openings 124 (e.g., referring to FIG. 1F), a channel layer 232 is conformally deposited over the conductive lines 110 and the gate dielectric layer 128, in accordance with some embodiments. The channel layer 232 may include a material similar to those described above for the channel layer 132. The channel layer 232 may be formed by ALD or other suitable CVD techniques. The channel layer 232 may have a thickness of about 3 nm to about one-third of the thickness T of the gate electrode 118. When the thickness of the channel layer 232 is smaller than about 3 nm, the carrier concentration in the channel layer 232 would be too low and may not generate sufficient drive current to meet the requirements of RRAM, MRAM, or PCRAM.

Figure 2B:
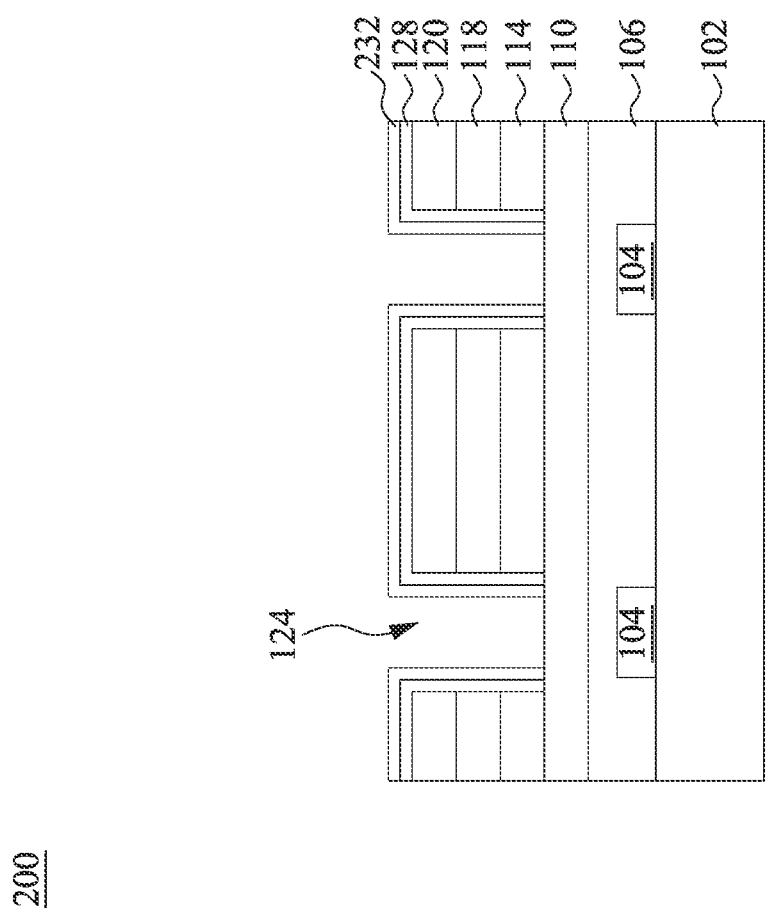
Figure 2C:
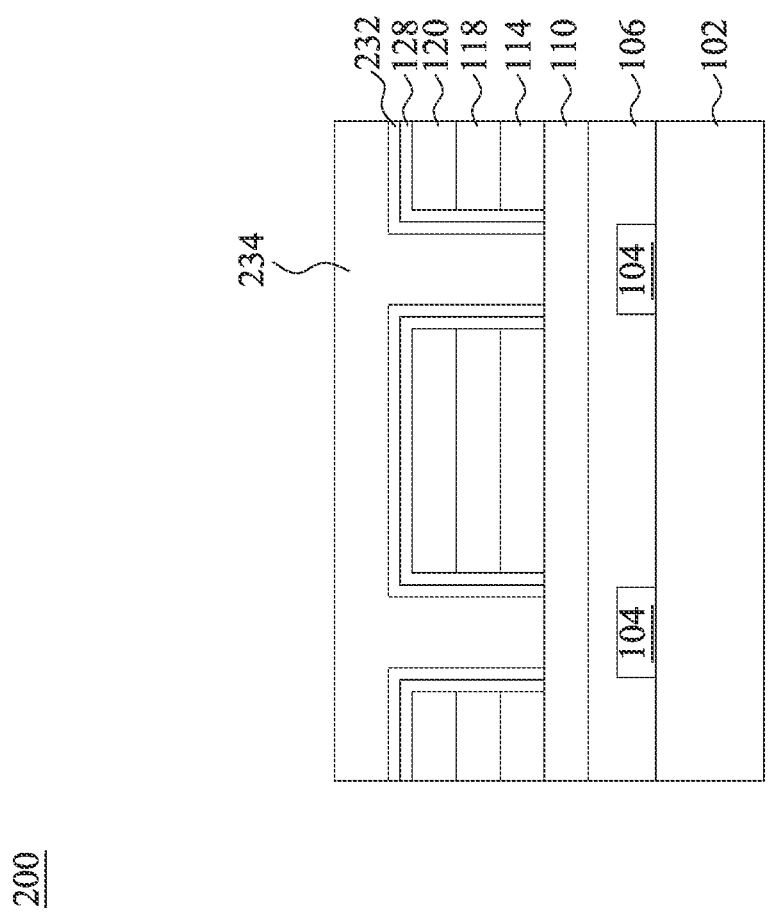
Figure 2D:
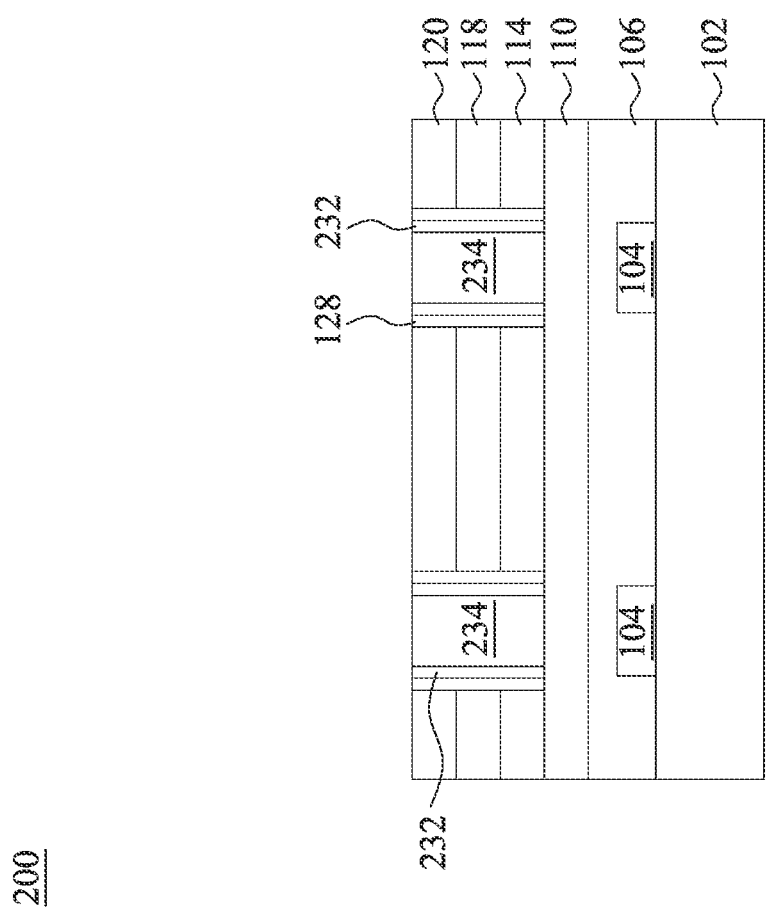

Referring to FIG. 2B, a bottom portion of the channel layer 232 is removed by an anisotropic etching process, and the conductive lines 110 are exposed, in accordance with some embodiments. In an embodiment, the anisotropic etching process includes an RIE process or an IBE process and is configured to etch the channel layer 232 with minimum lateral etching. Referring to FIG. 2C, an insulating layer 234 is formed for filling the openings 124, in accordance with some embodiments. The insulating layer 234 may include, silicon oxide, silicon oxynitride, silicon oxycarbide, a low-k dielectric layer, or combinations thereof. The insulating layer 234 may be formed by CVD, PVD, or other suitable methods.

Figure 2E:
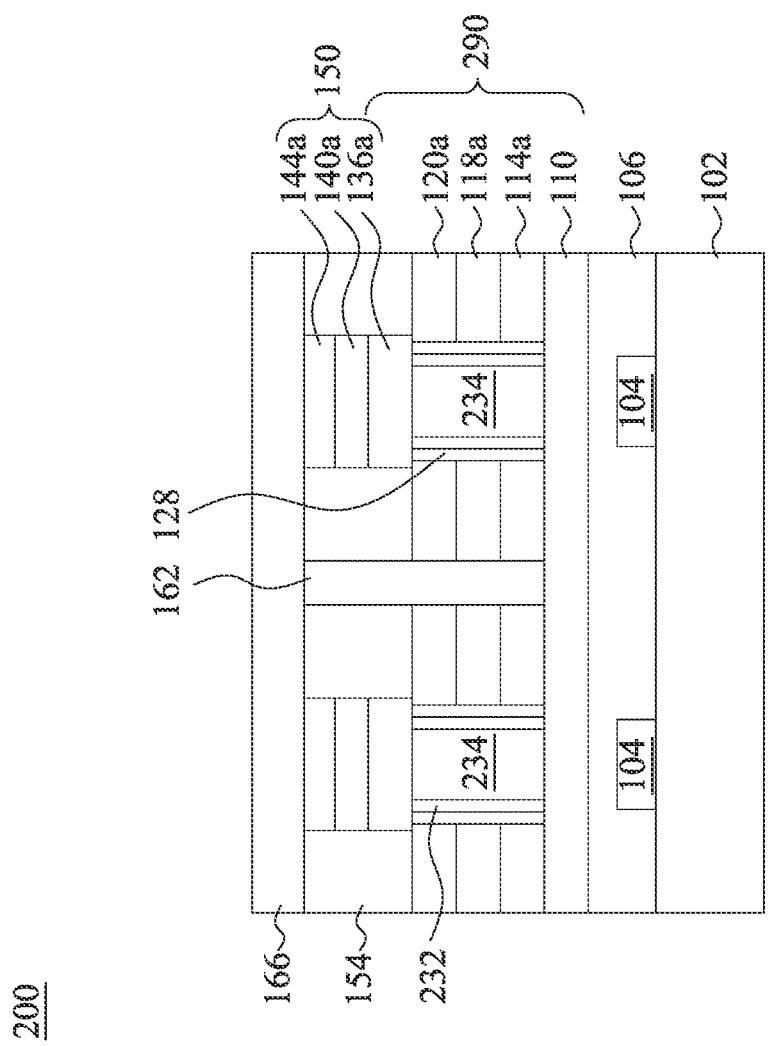

Referring to FIG. 2C, portions of the gate dielectric layer 128, the channel layer 232, and the insulating layer 234 over the dielectric layer 120 are removed by a planarization process such as CMP, leaving flattened top surfaces of the gate dielectric layer 128, the channel layer 232, the insulating layer 234, and the dielectric layer 120, in accordance with some embodiments. In some embodiments, both of the channel layer 232 and the gate dielectric layer 128 have a ring shape in each opening 124 in a plan view. The gate dielectric layer 128 and the channel layer 232 may be concentric in the openings 124 in a plan view. Afterward, proceeding steps similar to those steps illustrated in FIG. 1I to 1Q, memory cells including a memory array formed of the memory stacks 150 and a transistor array formed of select transistors 290 are formed, as illustrated in FIG. 2E. The select transistors 290 are similar to the select transistors 190 except that the select transistors 290 have a thin channel layer 232, and the channel layer 232 surrounds and encircles a sidewall of the insulating layer 234 in a plan view. Because the channel layer 232 is thin, the gate electrodes 118 can provide effective control to the $I_{off}$ current of the select transistors 290.

FIGS. 3A to 3E illustrate exemplary cross-sectional views of a semiconductor device 300 at intermediate stages in accordance with some embodiments of the present disclosure. In certain embodiments, the semiconductor device 300 is the same as the semiconductor device 100 or 200 except for the details described below.

Figure 3A:
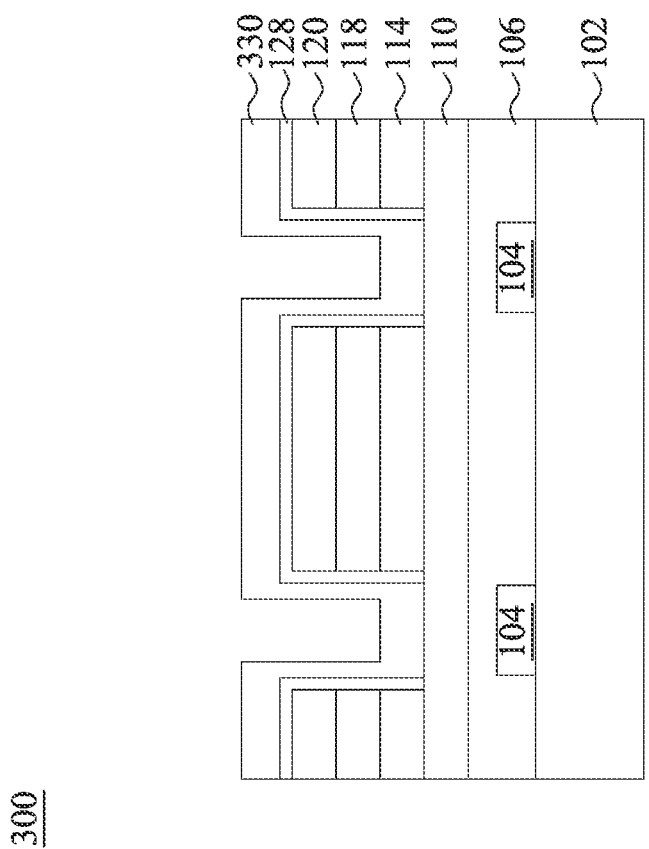
FIGS. 3A to 3G show exemplary cross-sectional views of a semiconductor device at intermediate stages in accordance with embodiments of the present disclosure.
Figure 3B:
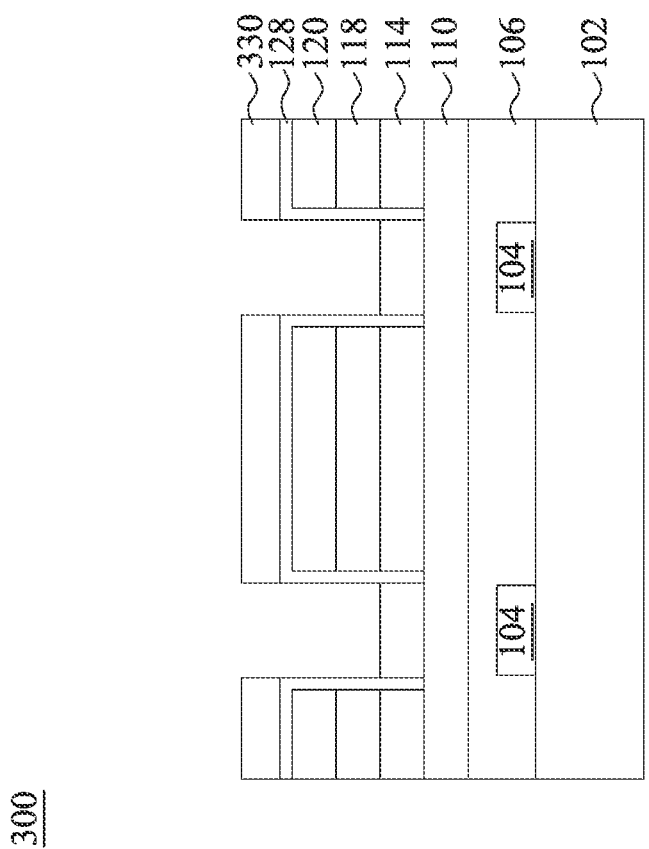

Referring to FIG. 3A, after the gate dielectric layer 128 is formed over a sidewall of the openings 124 (e.g., referring to FIG. 1F), an electrode material 330 is formed over the conductive lines 110 and the gate dielectric layer 128, in accordance with some embodiments. In some embodiments, the electrode material 330 is deposited by a method that offers relatively poor sidewall coverage, such as PVD. For example, the electrode material 330 may have a bottom thickness of 3-20 times thicker than its sidewall thickness. Referring to FIG. 3B, sidewall portions of the electrode material 330 are removed by an anisotropic etching process such as an RIE process or an IBE process. The anisotropic etching process may be configured to minimize sidewall redeposition and maximize bottom redeposition, for example, by employing an appropriate tilt angle. In some embodiments, the electrode material 330, after the removal of sidewall portions, has a thickness of about 0.1 nm to about 10 nm. The electrode material 330 may have a thickness of over half of the thickness of the dielectric layer 114. In some embodiments, the electrode material 330 includes a metal material. For example, the metal material may include a Ti-rich material such as TiN.

Figure 3C:
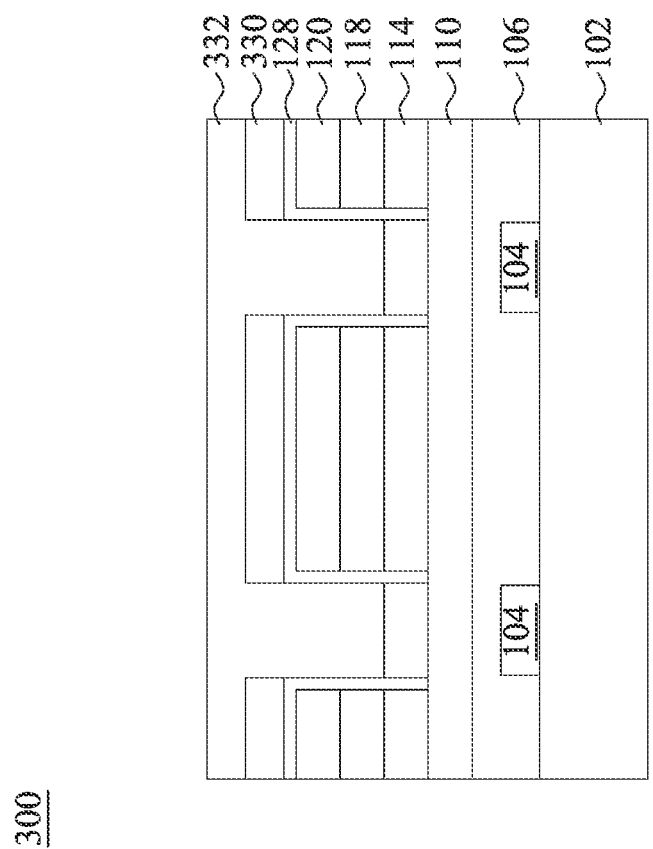

Referring to FIG. 3C, a channel layer 332 is formed over the electrode material 330 and fill the openings 124, in accordance with some embodiments. In some embodiments, the channel material 332 includes an oxide semiconductor such as indium oxide ($In_2O_3$), indium zinc oxide (IZO), zinc tin oxide (ZTO), indium gallium oxide (IGO), indium tungsten oxide (IWO), indium gallium zinc oxide (IGZO), tin oxide ($SnO_2$), nickel oxide (NiO), copper (I) oxide ($Cu_2O$), zinc oxide (ZnO), the like, or combinations thereof.

Figure 3D:
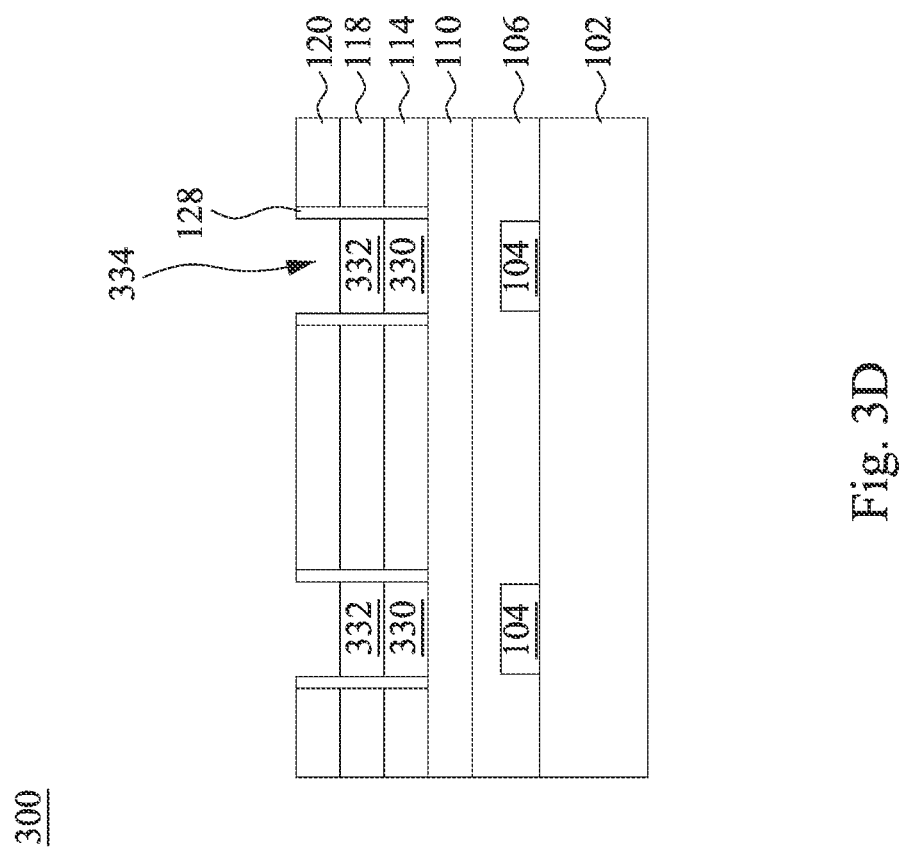

Referring to FIG. 3D, portions of the channel layer 332 and the electrode material 330 are removed, in accordance with some embodiments. In some embodiments, portions of the channel layer 332 and portions of the electrode material 330 over the dielectric layer 120 are removed by a planarization process such as CMP. The channel layer 332 may be then etched by an etching process and creates openings 334. The openings 334 may be surrounded by the dielectric layer 120. In some embodiments, the openings 334 have a height substantially equal to the thickness of the electrode material 330.

Figure 3E:
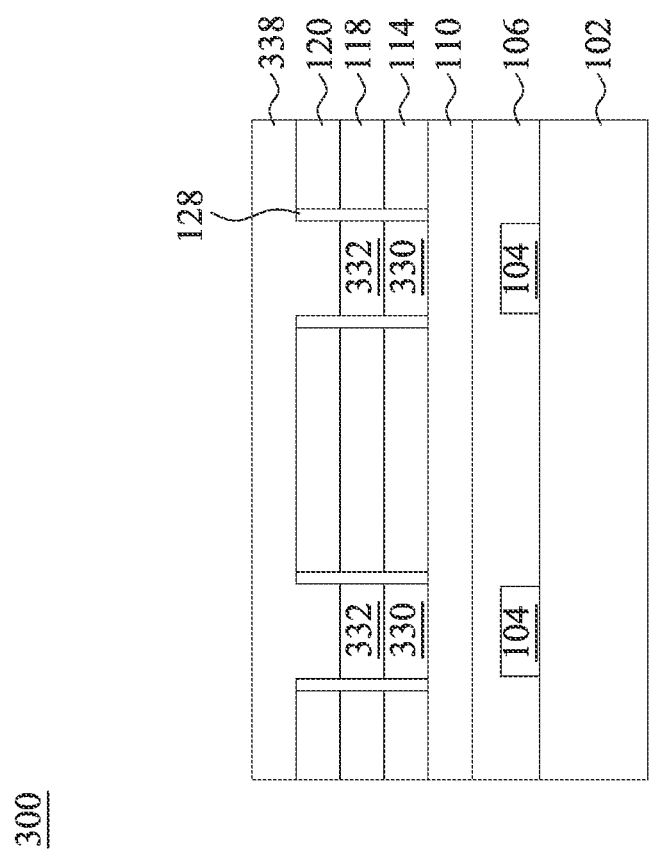
Figure 3H:
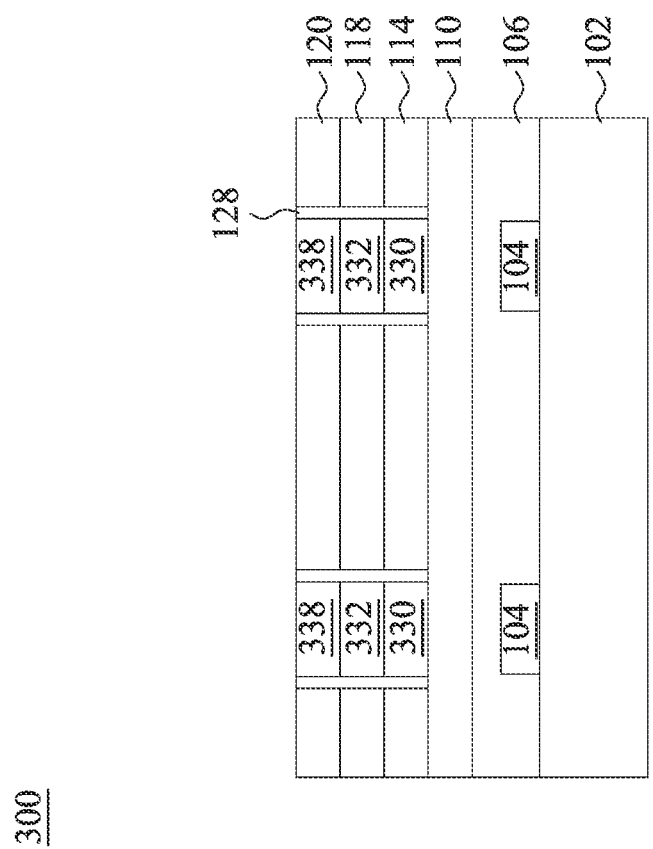
Figure 3G:
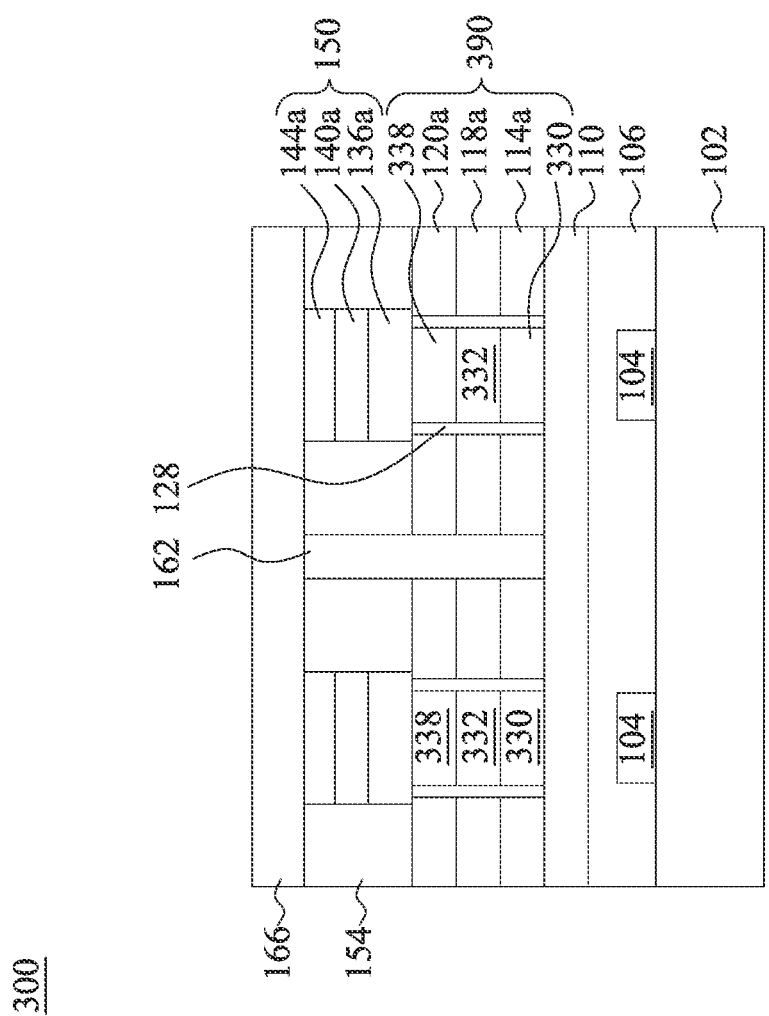

Referring to FIG. 3E, an electrode material 338 is formed over the channel layer 332 and fills the openings 334, in accordance with some embodiments. In an embodiment, the electrode material 338 overfills the openings 334, and portions of the electrode material 338 over the dielectric layer 120 may be removed by a planarization process such as CMP, as illustrated in FIG. 3F. Afterward, proceeding steps similar to those steps illustrated in FIG. 1I to 1Q, memory cells including a memory array formed of the memory stacks 150 and a transistor array formed of select transistors 390 are formed, as illustrated in FIG. 3G. The select transistors 390 are similar to select transistors 190 except that the select transistors 390 include source/drain electrodes 330 and 338 separate from the conductive lines 110 and the bottom electrode 136a. The channel layer 332 is vertically interposed by the source/drain electrodes 330 and 338 to provide vertical channels. In some embodiments, the channel layer 332 acquires oxygen that is diffused from and gettered by the source/drain electrodes 330 and 338 so that contact resistance between channel material and source/drain electrode is minimized.

Figure 4A:
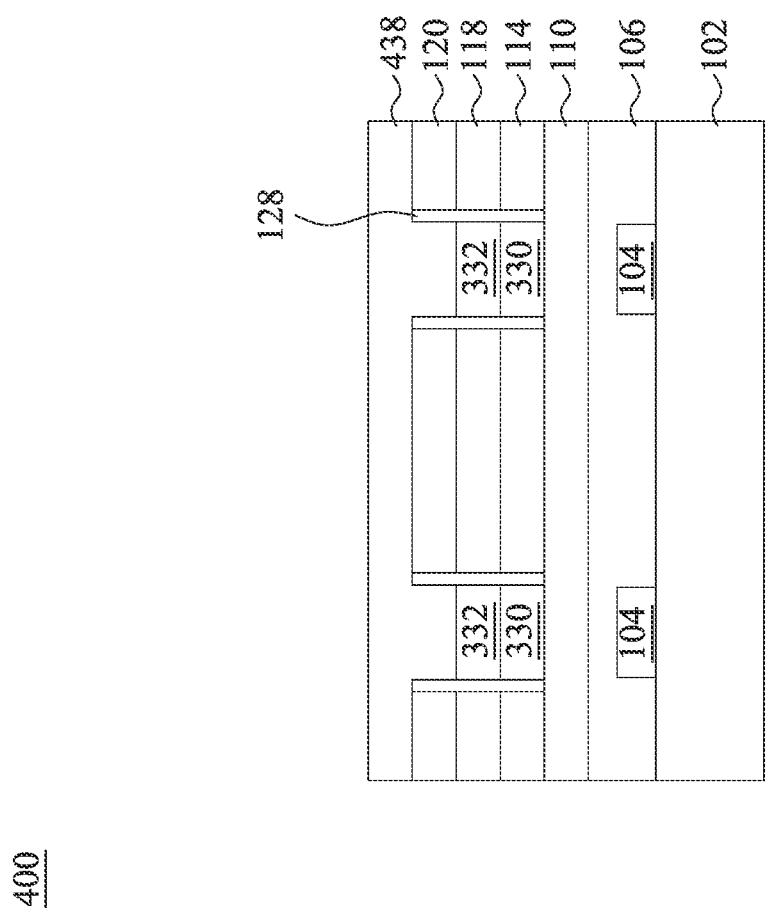
FIGS. 4A to 4D show exemplary cross-sectional views of a semiconductor device at intermediate stages in accordance with embodiments of the present disclosure.
Figure 4B:
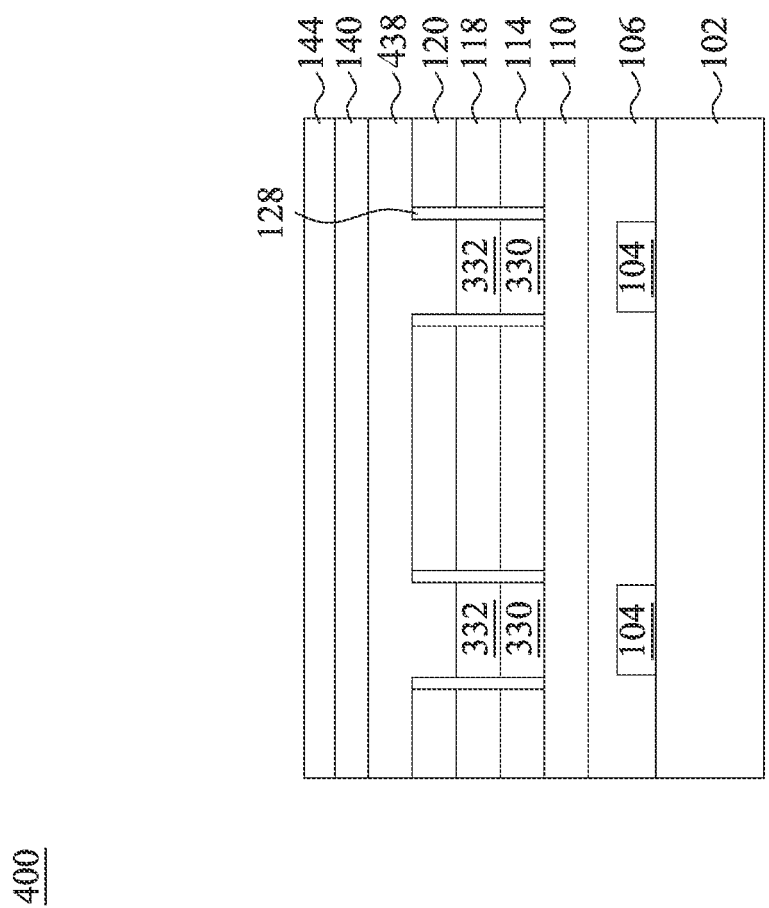

FIGS. 4A to 4B illustrate exemplary cross-sectional views of a semiconductor device 400 at intermediate stages in accordance with some embodiments of the present disclosure. In certain embodiments, the semiconductor device 400 is the same as the semiconductor device 300 except for the details described below.

Referring to FIG. 4A, after the channel layer 332 is etched to form openings 334 (e.g., referring to FIG. 3D), an electrode material 438 is formed over the dielectric layer 120 and fills the openings 334, in accordance with some embodiments. The electrode material 438 may include a material similar to those described above for the electrode material 338 and may be formed using similar methods. In some embodiments, a planarization process such as CMP is used to reduce the thickness of the electrode material 438 to the desired value and flatten the top surface of the electrode material 438.

Figure 4C:
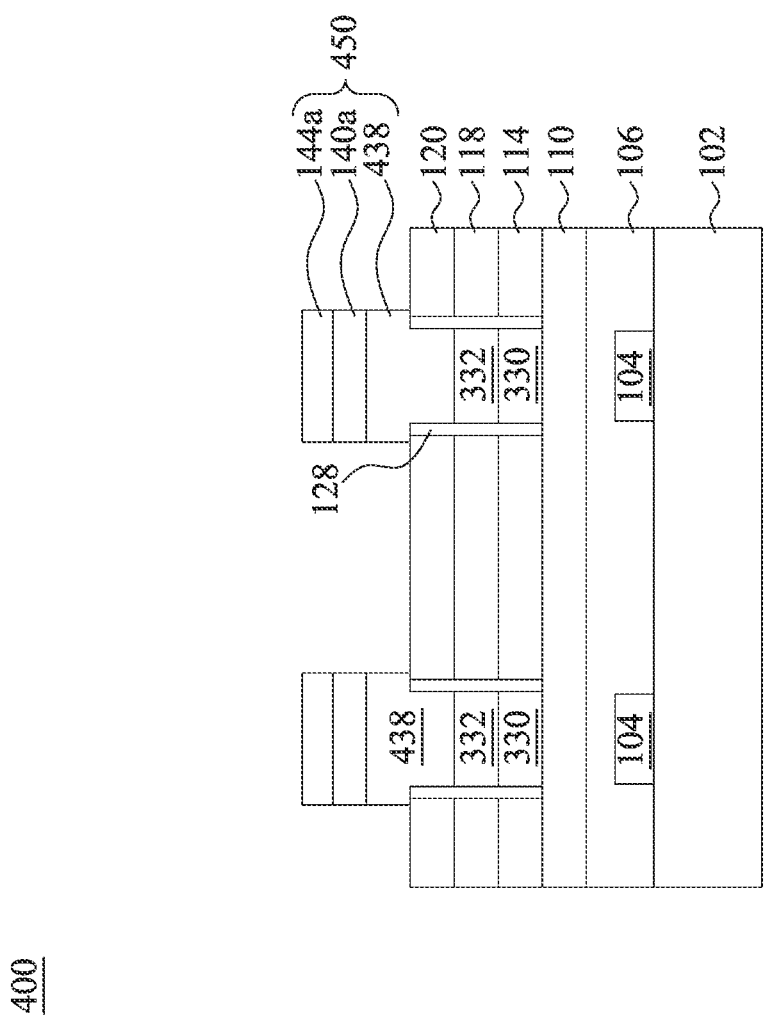
Figure 4D:
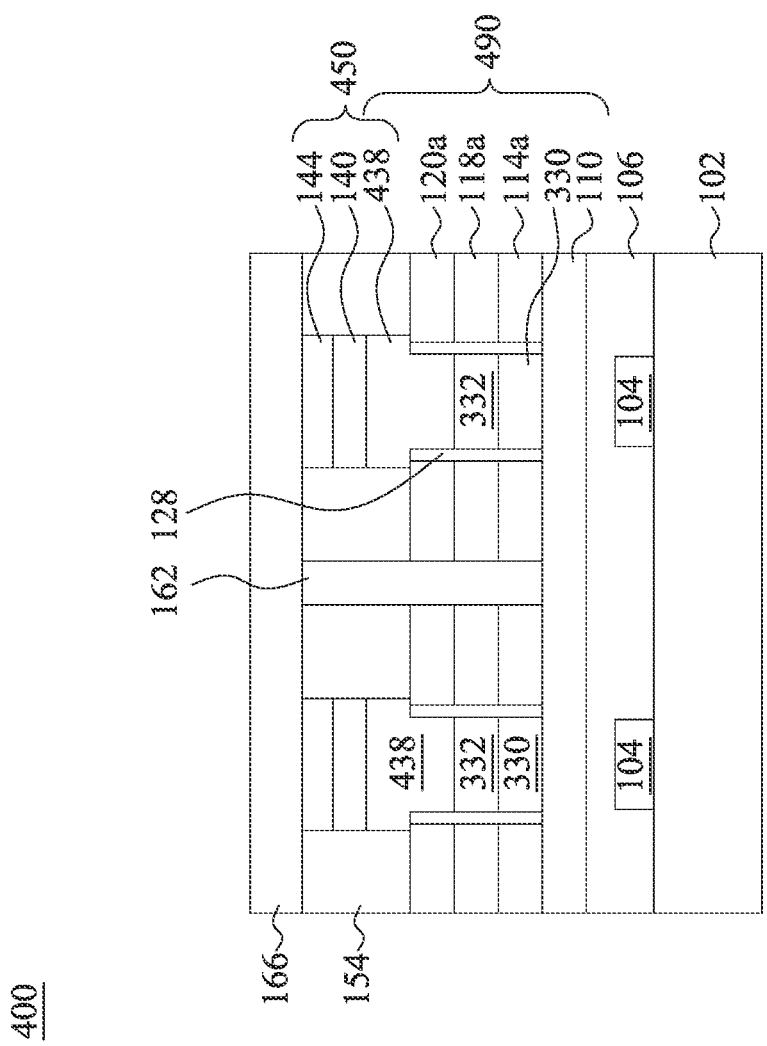

Referring to FIGS. 4B, the memory layer 140 and the top electrode layer 144 are formed over the electrode material 438, in accordance with some embodiments. Referring to FIG. 4C, the top electrode layer 144, the memory layer 140, and the electrode material 438 is patterned to form individual memory stacks 450, in accordance with some embodiments. In some embodiments, the electrode material 438 has a T-shape in a cross-sectional view. For example, the electrode material 438 may have a first portion having a width substantial the same as the channel layer 332 and a second portion having a width substantially the same as the memory element 140a. Afterward, proceeding steps similar to those steps illustrated in FIGS. 1M to 1Q, memory cells including a memory array formed of the memory stacks 450 and a transistor array formed of select transistors 490 are formed, as illustrated in FIG. 3G. The memory stacks 450 and the select transistor 490 are similar to the memory stacks 150 and the select transistor 390, respectively, except that the electrode material 438 have a T shape in a cross-sectional view. The electrode material 438 may be used as both of the bottom electrodes of the memory stacks 450 and the drain electrodes of the select transistors 490. A step of manufacturing individual bottom electrodes for memory stacks can be thus omitted.

FIGS. 5A to 5E illustrate exemplary cross-sectional views of a semiconductor device 100 at intermediate stages in accordance with some embodiments of the present disclosure. In certain embodiments, the semiconductor device 500 is the same as the semiconductor device 100, 200, or 300 except for the details described below.

Figure 5A:
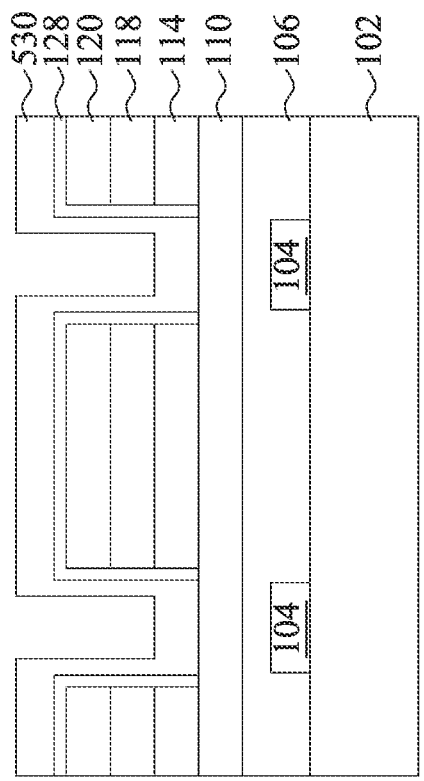
FIGS. 5A to 5G show exemplary cross-sectional views of a semiconductor device at intermediate stages in accordance with embodiments of the present disclosure.
Figure 5B:
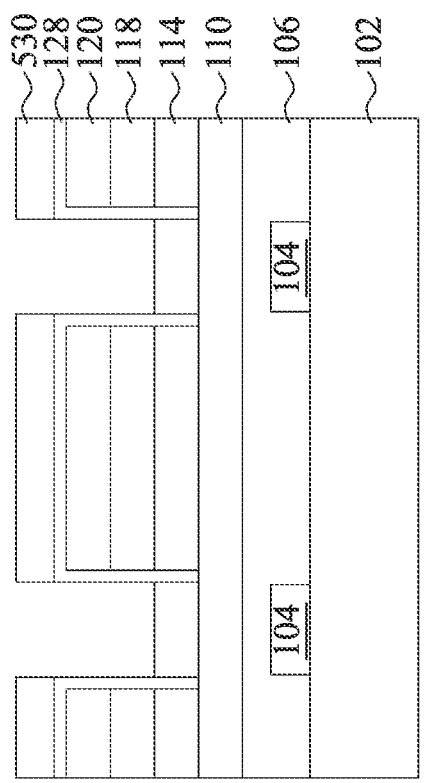

Referring to FIG. 5A, after the gate dielectric layer 128 is formed over sidewalls of opening 124 (e.g., as shown in FIG. 1F), an electrode material 530 is deposited over the conductive lines 110 and the gate dielectric layer 128, in accordance with some embodiments. In some embodiments, the electrode material is deposited by a method has a poor sidewall coverage such as PVD/CV, for example. For example, the electrode material 330 may have a bottom thickness of 3-20 times thicker than its sidewall thickness. Referring to FIG. 5B, sidewall portions of the electrode material 530 are removed by an anisotropic etching process such as an RIE process or an IBE process. The anisotropic etching process may be configured to minimize sidewall redeposition and maximize bottom redeposition. In some embodiments, the electrode material 530, after the removal of sidewall portions, has a thickness of about 0.1 nm to about 10 nm. For example, the electrode material 530 may have a thickness of over half of the thickness of the dielectric layer 114. In some embodiments, the electrode material 530 includes a doping material such as boron silicate glass (BSG) or phosphorous silicate glass (PSG).

Figure 5C:
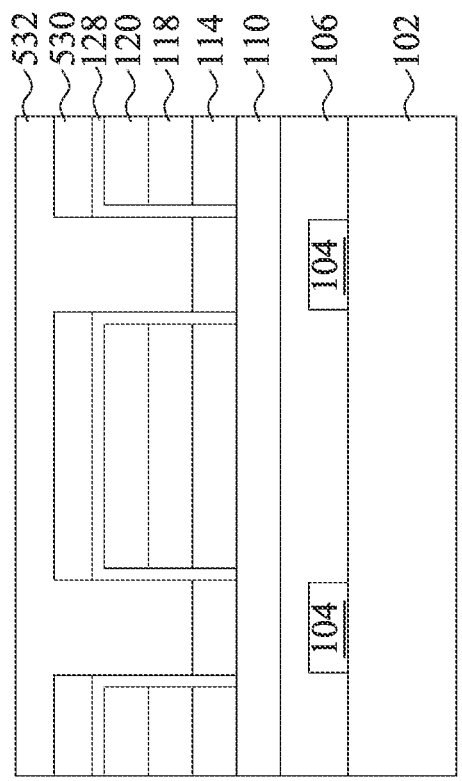

Referring to FIG. 5C, a channel layer 532 is formed over the electrode material 530 and fill the openings 124, in accordance with some embodiments. In some embodiments, the electrode material 532 includes polysilicon, Ge, SiGe, or a combination thereof. The electrode material 532 may be doped with a type opposite to the electrode material 530.

Figure 5D:
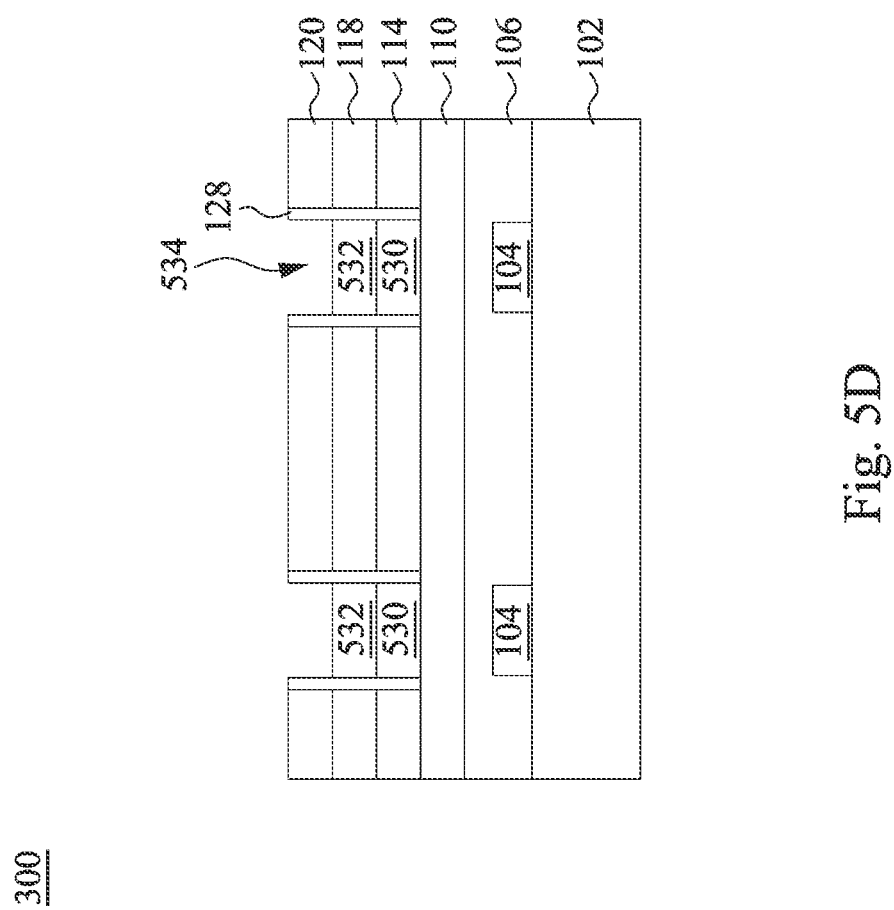

Referring to FIG. 5D, portions of the channel layer 332 and the electrode material 530 are removed, in accordance with some embodiments. In some embodiments, portions of the channel layer 332 and portions of the electrode material 530 over the dielectric layer 120 are removed by a planarization process such as CMP. The channel layer 332 may be then etched by an etching process and creates openings 534. The openings 534 may be surrounded by the dielectric layer 120. In some embodiments, the openings 534 have a height substantially equal to the thickness of the electrode material 530.

Figure 5E:
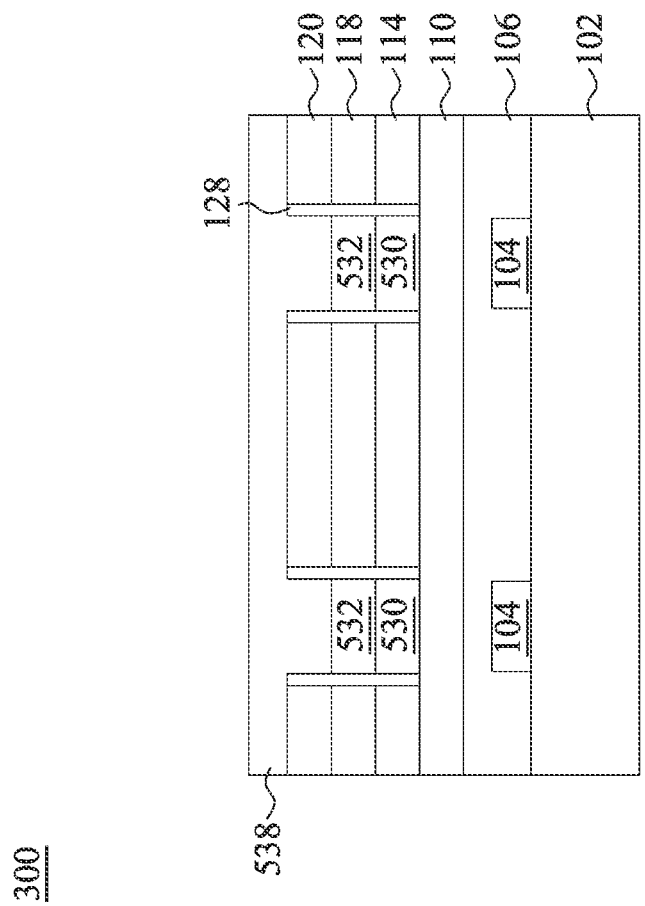
Figure 5F:
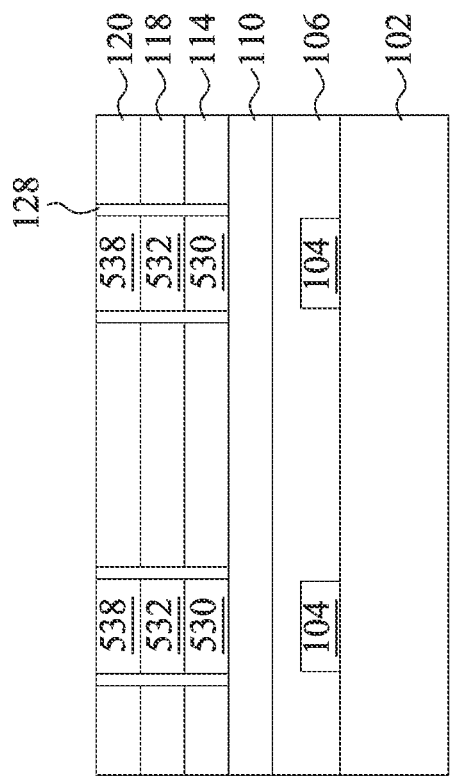
Figure 5G:
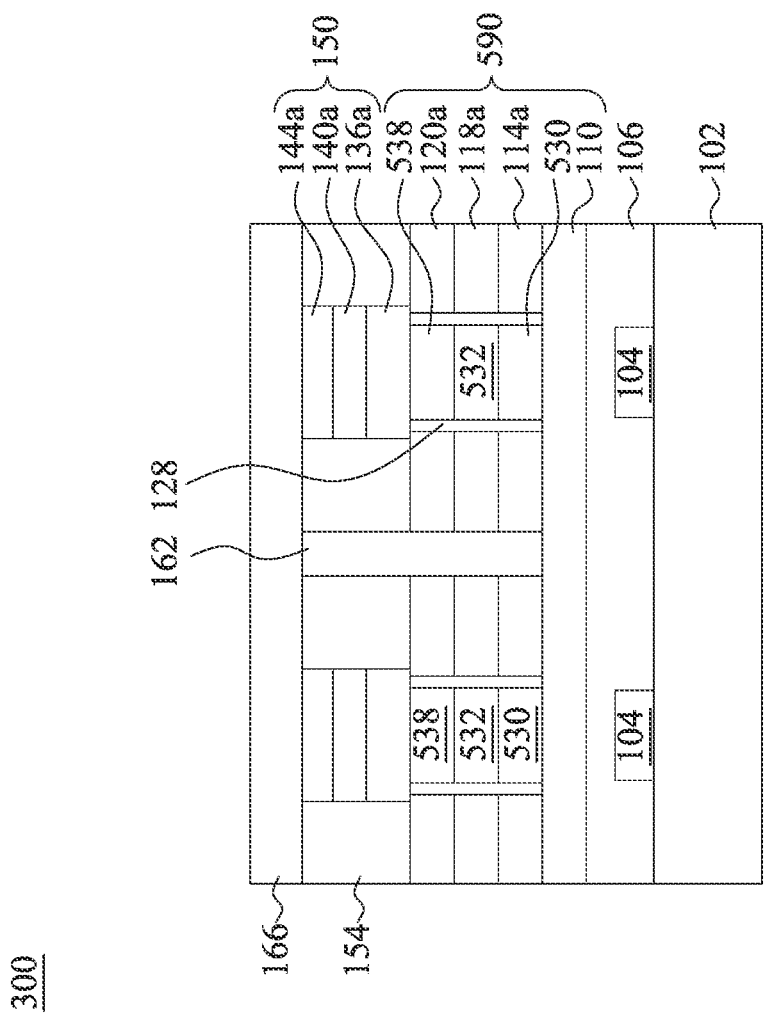

Referring to FIG. 5E, an electrode material 538 is formed over the channel layer 532 and fills the opening 534, in accordance with some embodiments. The electrode material 538 may include a material similar or the same as the electrode material 530. In an embodiment, the electrode material 538 overfills the opening 534, and portions of the electrode material 538 over the dielectric layer 120 may be removed by a planarization process such as CMP, as illustrated in FIG. 5F. Afterward, proceeding steps similar to those steps illustrated in FIGS. 1I to 1Q, memory cells including a memory array formed of the memory stacks 150 and a transistor array formed of select transistors 590 are formed, as illustrated in FIG. 5G. The select transistors 590 are similar to select transistors 190 except that the select transistors 590 include source/drain electrodes 530 and 538 separate from the conductive lines 110 and the bottom electrodes 136. The channel layer 532 may be vertically interposed by the source/drain electrodes 530 and 538 to provide vertical channels.

Figure 6A:
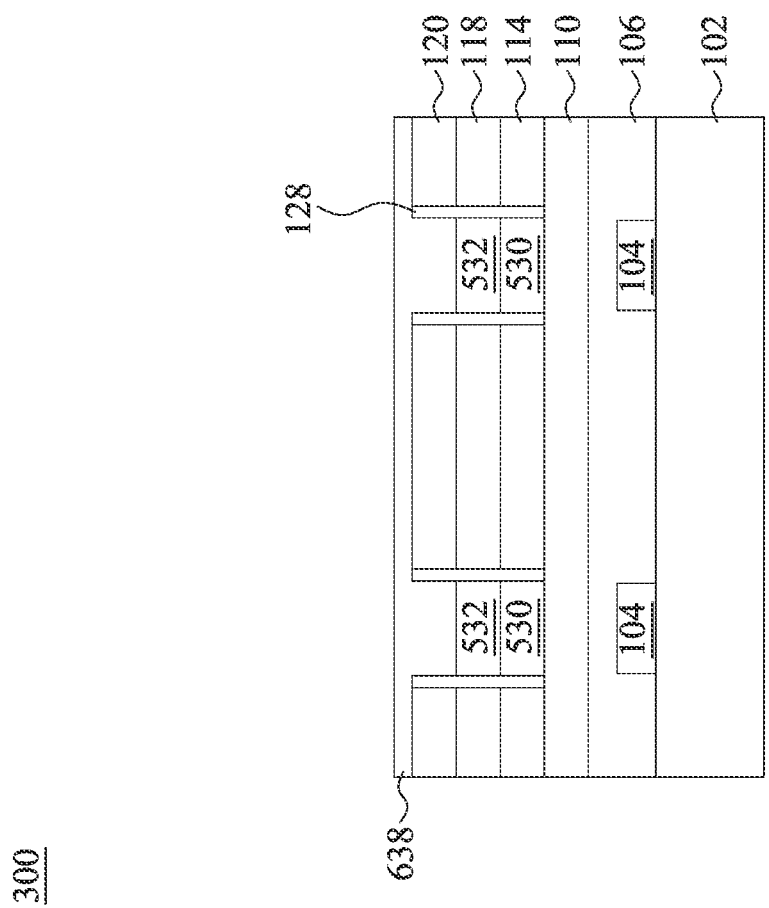
FIGS. 6A to 6C how exemplary cross-sectional views of a semiconductor device at intermediate stages in accordance with embodiments of the present disclosure.
Figure 6B:
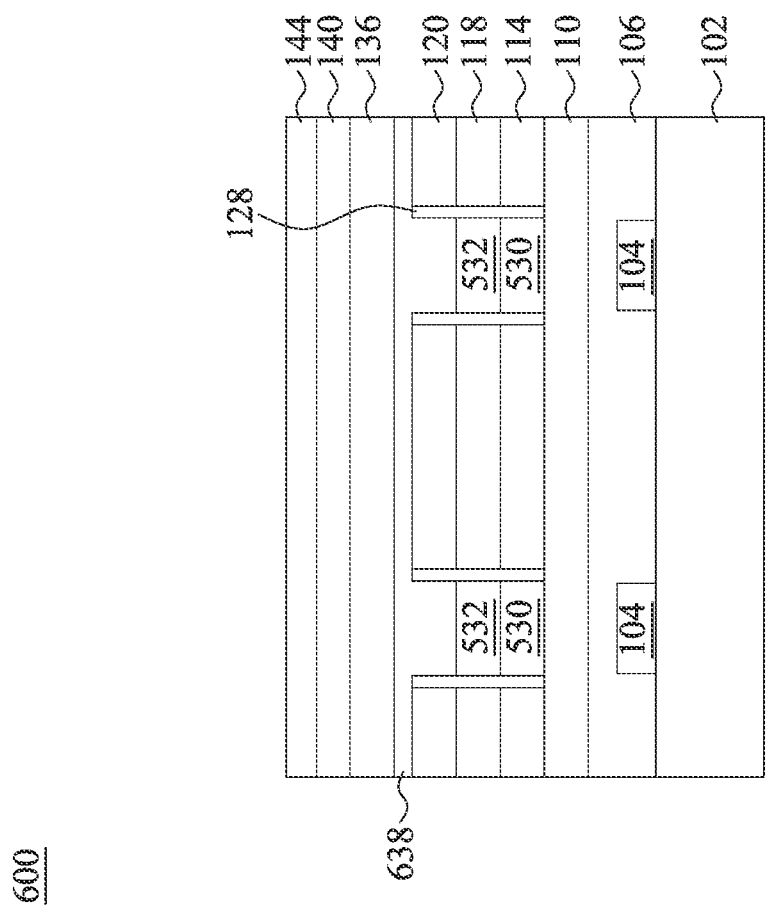

FIGS. 6A to 6B illustrate exemplary cross-sectional views of a semiconductor device 600 at intermediate stages in accordance with some embodiments of the present disclosure. In certain embodiments, the semiconductor device 600 is the same as the semiconductor device 500 except for the details described below.

Referring to FIG. 6A, after the channel layer 532 is etched to form openings 534 (e.g., referring to FIG. 5D), an electrode material 638 is formed over the dielectric layer 120 and fills the opening 534, in accordance with some embodiments. The electrode material 638 may include a material similar to those described above for the electrode material 538 and may be formed using similar methods. In some embodiments, a planarization process such as CMP is used to reduce the thickness of the electrode material 638 to the desired value and flatten the top surface of the electrode material 638.

Figure 6C:
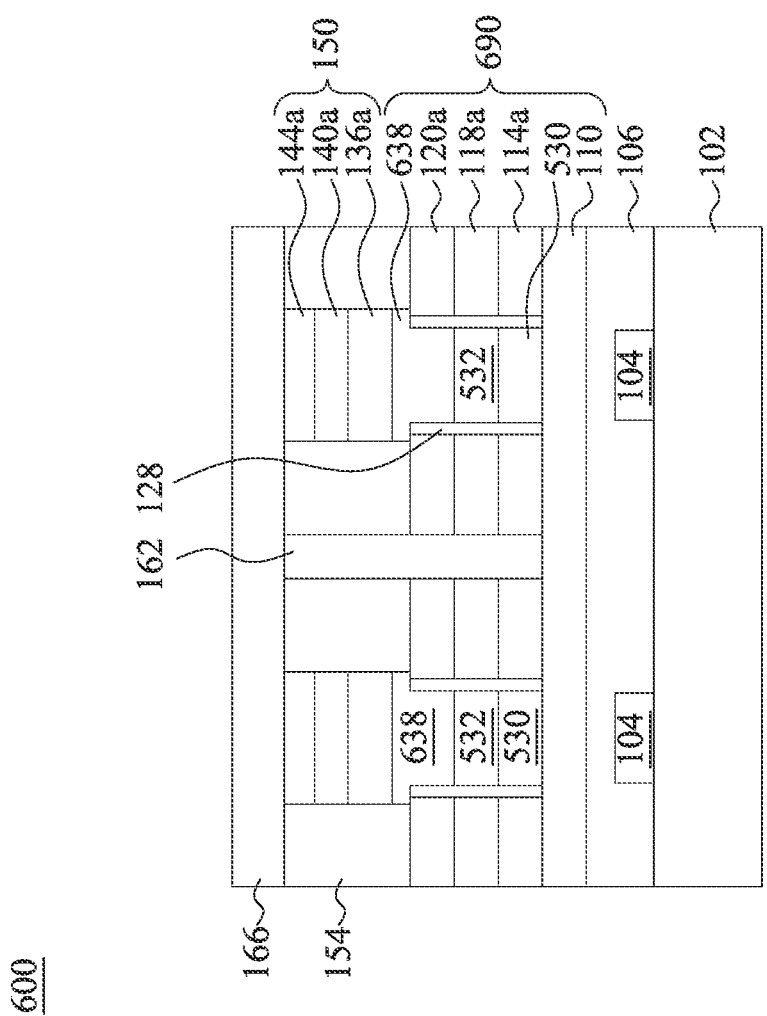

Referring to FIGS. 6B, the bottom electrode layer 136, the memory layer 140, and the top electrode layer 144 are formed over the electrode material 638, in accordance with some embodiments. Referring to FIG. 6C, the top electrode layer 144, the memory layer 140, the bottom electrode layer 136, and the electrode material 638 are patterned together, in accordance with some embodiments. In some embodiments, the electrode material 638 has a T-shape in a cross-sectional view, and the memory stacks 150 are formed over the electrode material 638. Afterward, proceeding steps similar to those steps illustrated in FIGS. 1M to 1Q, memory cells including a memory array formed of the memory stacks 150 and a transistor array formed of select transistors 690 are formed, as illustrated in FIG. 6C. The select transistors 690 are similar to the select transistors 590 except that the drain electrodes 638 of the select transistors 690 have a T-shape. Because the drain electrodes 638 of the transistors 690 are patterned together with the memory stacks 150, the tolerance window of aligning the memory stacks 150 to the selector transistors can be increased.

Figure 7A:
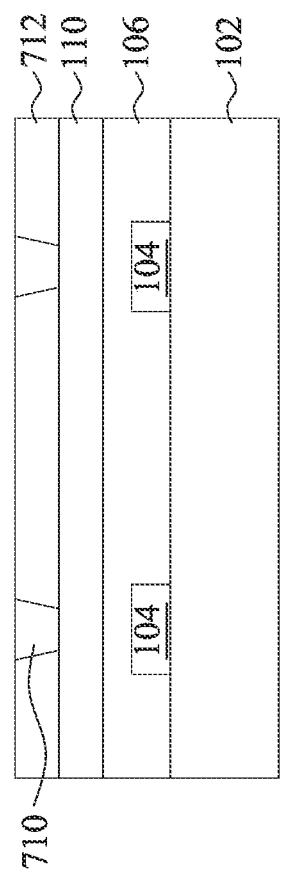
FIGS. 7A to 7B show exemplary cross-sectional views of a semiconductor device at intermediate stages in accordance with embodiments of the present disclosure.
Figure 7B:
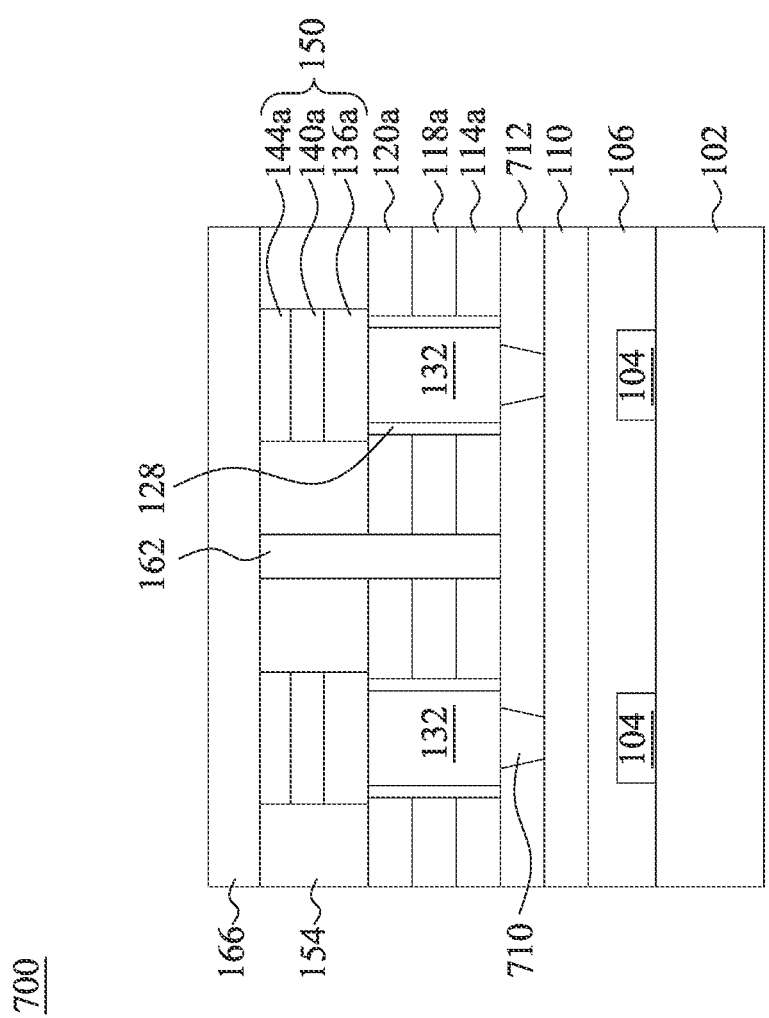

FIGS. 7A to 7B illustrate exemplary cross-sectional views of a semiconductor device 700 at intermediate stages in accordance with some embodiments of the present disclosure. In certain embodiments, the semiconductor device 700 is the same as the semiconductor device 100 except for the details described below. Referring to FIG. 7A, after the conductive lines 110 are formed (e.g., referring to FIG. 1B), conductive vias 710 are formed over the conductive lines 110. In some embodiments, the conductive vias 710 are formed in a dielectric layer 712. The conductive vias 710 may include a material similar to those described above for the conductive lines 110 and may be formed by a damascene process. The dielectric layer 712 may include a material to those described above for the ILD layer that the conductive lines 110 formed therein, and it may be formed by any suitable CVD technique. The conductive vias 710 may provide the similar function as the conductive lines 110 (e.g., source electrode), thereby providing more flexibility to match inter metal dielectric height required by certain foundry BEOL process. Afterward, proceeding steps similar to those steps illustrated in FIGS. 1C to 1Q, memory cells including a memory array formed of the memory stacks 150 and a transistor array formed of select transistors 190 are formed, as illustrated in FIG. 7B, The conductive vias 710 may be used as source lines with the conductive lines 110. Although the semiconductor device 700 is illustrated using the integration scheme of the semiconductor device 100, it is understood that the conductive vias 710 can be used in semiconductor devices in various embodiments of the present disclosure, including the semiconductor devices 200, 300, 400, 500, and 600 illustrated above.

Figure 8:
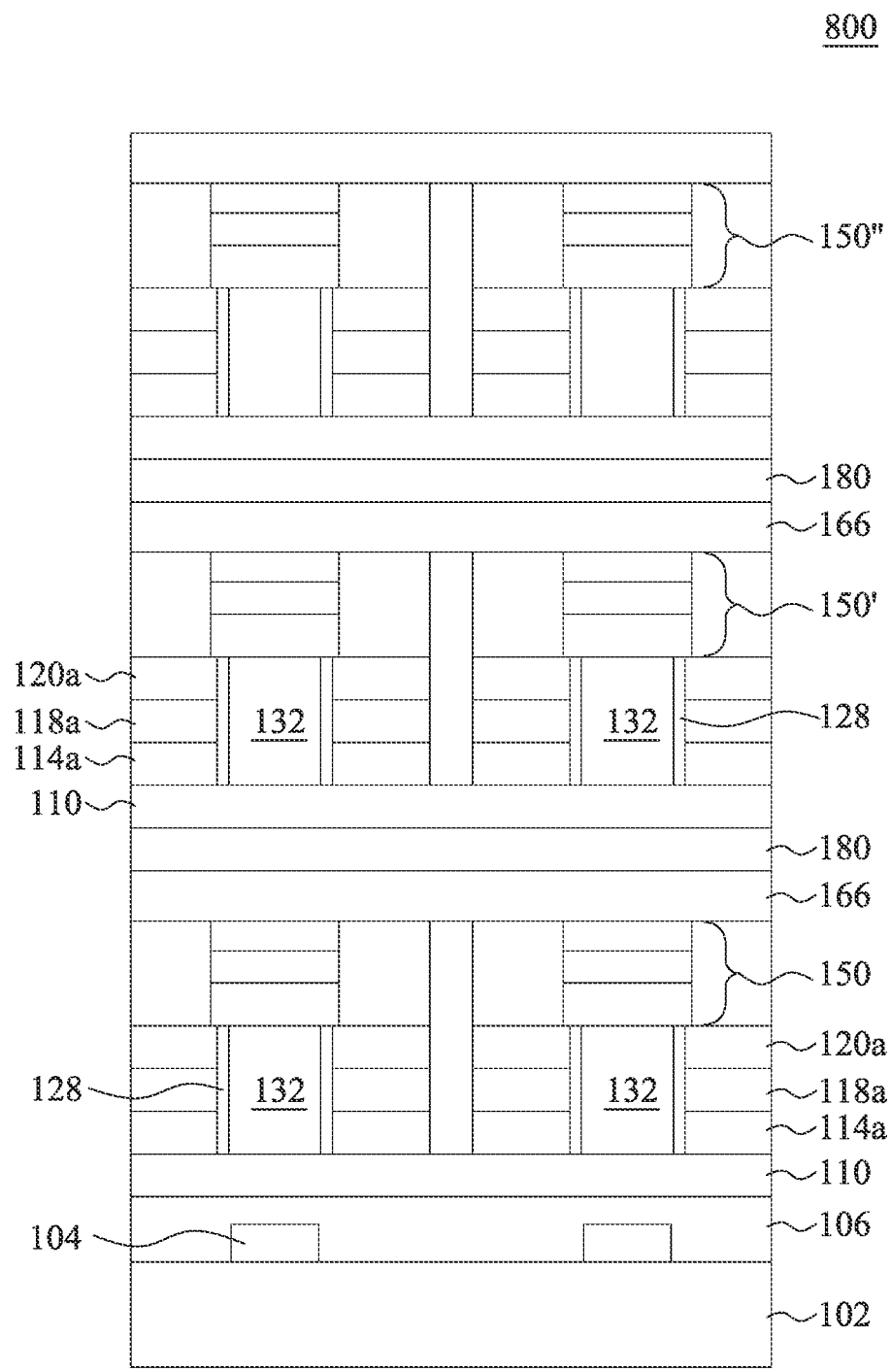
FIG. 8 shows exemplary cross-sectional views of a semiconductor device at intermediate stages in accordance with embodiments of the present disclosure.

FIG. 8 illustrates an exemplary cross-sectional view of a semiconductor device 800 at intermediate stages in accordance with some embodiments of the present disclosure. In FIG. 8, the semiconductor device 800 includes multiple levels of memory cells. Each of the memory cells is interposed by a dielectric layer 180. The dielectric layer 180 may include a material similar to those described above for the dielectric layer 154 and may be formed by similar methods. In some embodiments, the semiconductor device 800 includes a single-type memory structure. Memory stacks 150, 150', 150" in different levels of the memory arrays may be the same type of memory, such as RRAM, MRAM, or PCRAM (e.g., having a memory element formed of a resistive material, a phase change material, or a MJT structure). In other embodiments, the semiconductor device 800 includes a hybrid-type memory structure. For example, the memory stacks 150, 150', 150" in different levels of the memory arrays may include different types of the memory, such as a combination selected from the RRAM, MRAM, and PCRAM. Although the semiconductor device 700 is illustrated using the integration scheme of the semiconductor device 100, it is understood that the single-type or hybrid-type memory structure of the semiconductor device 800 can be used in various embodiments of the present disclosure, including the semiconductor devices 200, 300, 400, 500, 600, and 700 illustrated above.

In an embodiment, a semiconductor device includes a substrate, a first conductive line over the substrate and extending along a first direction, a transistor disposed over the first conductive line, and a memory stack disposed over the transistor. The transistor includes a channel layer, a gate dielectric layer surrounding a sidewall of the channel layer, and a gate electrode surrounding a sidewall of the gate dielectric layer and extending along a second direction.

In an embodiment, a semiconductor device includes a substrate, a first transistor array over the substrate, a first insulating layer covering the first transistor array, a second transistor array disposed over the first insulating layer, and first memory stacks disposed over and connected to the second transistor array, wherein a transistor of the second transistor array includes a first channel layer, a first gate dielectric layer surrounding a sidewall the channel layer, and a first gate electrode surrounding a sidewall of the gate dielectric layer.

In an embodiment, a method including forming a first a conductive line over a substrate; forming a gate electrode layer over the first conductive line; forming openings in the gate electrode layer; forming a gate dielectric layer over a sidewall of the openings; forming a channel layer over a sidewall of the gate dielectric layer in the openings; forming a memory stack disposed over the channel layer; and separating the gate electrode layer to gate electrodes, wherein the gate electrodes surround a sidewall of the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first transistor disposed over a substrate;
   a conductive line disposed over the first transistor;
   a memory cell disposed over the conductive line, the memory cell including:
     a second transistor, wherein the second transistor comprises:
       a channel layer;
       a gate dielectric layer surrounding a sidewall of the channel layer; and
       a gate electrode surrounding a sidewall of the gate dielectric layer; and
     a memory element disposed over the second transistor, wherein the second transistor is vertically interjacent the conductive line and the memory element, and wherein the memory element is vertically interjacent the second transistor and a bit line of the memory cell.

2. The semiconductor device of claim 1, wherein the channel layer has a pillar shape.

3. The semiconductor device of claim 1, wherein the channel layer has a ring shape in a plan view.

4. The semiconductor device of claim 3, wherein the channel layer surrounds a sidewall of an insulating layer in the plan view.

5. The semiconductor device of claim 1, wherein the second transistor further comprises a first electrode and a second electrode separated by the channel layer.

6. The semiconductor device of claim 5, wherein the first electrode has been disposed below the channel layer and comprises a conductive line extending along a first direction.

7. The semiconductor device of claim 5, wherein the first electrode has been disposed below the channel layer and has a sidewall aligned with a sidewall of the channel layer.

8. The semiconductor device of claim 7, wherein each of the first electrode and the second electrode comprise a metal material or a doped semiconductor material.

9. The semiconductor device of claim 5, wherein the second electrode has a portion that has been over the gate dielectric layer and has a sidewall aligned with a sidewall of the memory element.

10. The semiconductor device of claim 1, wherein the channel layer comprises IGO, ZnO, IGZO, IWO, or a combination thereof.

11. The semiconductor device of claim 1, wherein the channel layer comprises polysilicon, Ge, SiGe, or a combination thereof.

12. The semiconductor device of claim 1, wherein the second transistor further comprises spacers around the gate electrode, and wherein the spacers have a ring shape in a plan view.

13. The semiconductor device of claim 1, wherein the memory element comprises a resistive material, a phase change material or a magnetic tunnel junction structure.

14. A semiconductor device comprising:
   a substrate;
   a first transistor array over the substrate;
   a first insulating layer covering the first transistor array;
   a second transistor array disposed over the first insulating layer, wherein a transistor of the second transistor array comprises:
     a first channel layer;
     a first gate dielectric layer surrounding a sidewall of the first channel layer; and
     a first gate electrode surrounding a sidewall of the first gate dielectric layer; and
   a first memory element having a first electrode disposed over and electrically connected to the second transistor; and
   a bit line disposed over and electrically connected to a second electrode of the memory element.

15. The semiconductor device of claim 14, wherein the first transistor array includes a FinFET, a gate-all-around FET, or a planar FET.

16. The semiconductor device of claim 14, further comprising a third transistor array and second memory elements disposed over the first memory elements, wherein the second memory elements have been electrically connected to the third transistor array.

17. The semiconductor device of claim 16, wherein the first memory elements and the second memory elements comprise different types of memory.

18. A semiconductor device, comprising:
   a first transistor disposed over a substrate;
   a second transistor disposed over the first transistor, wherein the second transistor comprises:
     a columnar channel layer;
     a gate dielectric layer surrounding the columnar channel layer;
     a gate electrode layer surrounding the gate dielectric layer; and
   a memory element over, vertically overlapping, and contacting the second transistor at a first contact point, the memory element also contacting a bit line at a second contact point, the second contact point being over and vertically overlapping the first contact point.

19. The semiconductor device of claim 18, wherein the columnar channel layer has a ring shape in a plan view.

20. The semiconductor device of claim 18, wherein the second transistor further comprises a first electrode and a second electrode above the first electrode, the first electrode and the second electrode being separated by the columnar channel layer.

* * * * *